United States Patent
Baliarda et al.

(10) Patent No.: US 7,245,196 B1
(45) Date of Patent: Jul. 17, 2007

(54) FRACTAL AND SPACE-FILLING TRANSMISSION LINES, RESONATORS, FILTERS AND PASSIVE NETWORK ELEMENTS

(75) Inventors: Carles Puente Baliarda, Tiana (ES); Juan Manuel O'Callaghan Castella, Barcelona (ES); Edouard Jean Louis Rozan, Barcelona (ES); Juan Carlos Collado Gomez, Hospitalet de Llobregat (ES); Nuria Duffo Ubeda, Barcelona (ES)

(73) Assignee: Fractus, S.A., Barcelona (ES)

( * ) Notice: Subject to any disclaimer, the term of this patent is extended or adjusted under 35 U.S.C. 154(b) by 0 days.

(21) Appl. No.: 10/181,790

(22) PCT Filed: Jan. 19, 2000

(86) PCT No.: PCT/EP00/00422

§ 371 (c)(1),
(2), (4) Date: Nov. 4, 2002

(87) PCT Pub. No.: WO01/54221

PCT Pub. Date: Jul. 26, 2001

(51) Int. Cl.
*H01P 7/08* (2006.01)
(52) U.S. Cl. ..................... 333/219; 333/99 S
(58) Field of Classification Search ............. 333/204, 333/219, 99 S
See application file for complete search history.

(56) References Cited

U.S. PATENT DOCUMENTS

| | | | |
|---|---|---|---|
| 3,521,284 A | 7/1970 | Shelton, Jr. et al. | |
| 3,599,214 A | 8/1971 | Altmayer | |
| 3,622,890 A | 11/1971 | Fujimoto et al. | |
| 3,683,376 A | 8/1972 | Pronovost | |
| 3,967,276 A | 6/1976 | Goubau | |
| 3,969,730 A | 7/1976 | Fuchser | |
| 4,024,542 A | 5/1977 | Ikawa et al. | |
| 4,131,893 A | 12/1978 | Munson et al. | |
| 4,471,493 A | 9/1984 | Schober | |
| 4,504,834 A | 3/1985 | Garay et al. | |
| 4,536,725 A * | 8/1985 | Hubler | 333/204 |
| 4,543,581 A | 9/1985 | Nemet | |
| 4,571,595 A | 2/1986 | Phillips et al. | |
| 4,584,709 A | 4/1986 | Kneisel et al. | |

(Continued)

FOREIGN PATENT DOCUMENTS

EP         0543645         5/1993

(Continued)

OTHER PUBLICATIONS

Ali, M. et al., "A Triple-Band Internal Antenna for Mobile Handheld Terminals," IEEE, pp. 32-35 (1992).

(Continued)

*Primary Examiner*—Benny Lee
(74) *Attorney, Agent, or Firm*—Winstead PC

(57) ABSTRACT

This invention relates to high frequency electromagnetic circuits, in particular to those made on planar or quasi-planar substrates, where the circuit is patterned on a metallic or superconducting film on top of a dielectric in any of the configurations known to those skilled in the art (for instance micro-strip, strip-line, co-planar, parallel plate or slot-line configurations). A part of the circuit such as the characteristic strip or slot of said configurations is shaped in a novel space-filling geometry which allows a significant size reduction of the circuital component. Miniature transmission lines, capacitors, inductors, resistors, filters and oscillators can be manufactured this way.

8 Claims, 41 Drawing Sheets

U.S. PATENT DOCUMENTS

| | | |
|---|---|---|
| 4,590,614 A | 5/1986 | Erat |
| 4,730,195 A | 3/1988 | Phillips et al. |
| 4,839,660 A | 6/1989 | Hadzoglou |
| 4,847,629 A | 7/1989 | Shimazaki |
| 4,857,939 A | 8/1989 | Shimazaki |
| 4,890,114 A | 12/1989 | Egashira |
| 4,894,663 A | 1/1990 | Urbish et al. |
| 4,975,711 A | 12/1990 | Lee |
| 5,030,963 A | 7/1991 | Tadama |
| 5,138,328 A | 8/1992 | Zibrik et al. |
| 5,172,084 A | 12/1992 | Fiedziuszko et al. ....... 333/204 |
| 5,200,756 A | 4/1993 | Feller |
| 5,214,434 A | 5/1993 | Hsu |
| 5,218,370 A | 6/1993 | Blaese |
| 5,227,804 A | 7/1993 | Oda |
| 5,227,808 A | 7/1993 | Davis |
| 5,245,350 A | 9/1993 | Sroka |
| 5,257,032 A | 10/1993 | Diamond et al. |
| 5,347,291 A | 9/1994 | Moore |
| 5,373,300 A | 12/1994 | Jenness et al. |
| 5,420,599 A | 5/1995 | Erkocevic |
| 5,422,651 A | 6/1995 | Chang |
| 5,451,965 A | 9/1995 | Matsumoto |
| 5,451,968 A | 9/1995 | Emery |
| 5,457,469 A | 10/1995 | Diamond et al. |
| 5,493,702 A | 2/1996 | Crowley et al. |
| 5,684,672 A | 11/1997 | Karidis et al. |
| 5,767,811 A | 6/1998 | Mandai et al. |
| 5,821,907 A | 10/1998 | Zhu et al. |
| 5,841,403 A | 11/1998 | West |
| 5,870,066 A | 2/1999 | Asakura et al. |
| 5,872,546 A | 2/1999 | Ihara et al. |
| 5,898,404 A | 4/1999 | Jou |
| 5,903,240 A | 5/1999 | Kawahata et al. |
| 5,943,020 A | 8/1999 | Liebendoerfer et al. |
| 5,966,098 A | 10/1999 | Qi et al. |
| 5,973,651 A | 10/1999 | Suesada et al. |
| 5,990,838 A | 11/1999 | Burns et al. |
| 6,002,367 A | 12/1999 | Engblom et al. |
| 6,028,568 A | 2/2000 | Asakura et al. |
| 6,031,505 A | 2/2000 | Qi et al. |
| 6,104,349 A | 8/2000 | Cohen |
| 6,122,533 A * | 9/2000 | Zhang et al. ............... 505/210 |
| 6,127,977 A | 10/2000 | Cohen |
| 6,140,975 A | 10/2000 | Cohen |
| 6,218,992 B1 | 4/2001 | Sadler et al. |
| 6,329,951 B1 | 12/2001 | Wen et al. |
| 6,329,954 B1 | 12/2001 | Fuchs et al. |
| 6,407,710 B2 | 6/2002 | Keilen et al. |
| 6,445,352 B1 | 9/2002 | Cohen |
| 6,452,549 B1 | 9/2002 | Lo |
| 6,452,553 B1 | 9/2002 | Cohen |
| 7,015,868 B2 | 3/2006 | Puente |
| 7,019,695 B2 | 3/2006 | Cohen |
| 2002/0109633 A1 | 8/2002 | Ow et al. |
| 2002/0190904 A1 | 12/2002 | Cohen |
| 2003/0160723 A1 | 8/2003 | Cohen |

FOREIGN PATENT DOCUMENTS

| | | |
|---|---|---|
| EP | 0571124 | 11/1993 |
| EP | 0765001 | 3/1997 |
| EP | 0814536 | 12/1997 |
| EP | 0892459 | 1/1999 |
| EP | 0932219 | 7/1999 |
| EP | 0997974 | 5/2000 |
| EP | 1018777 | 7/2000 |
| EP | 1018779 | 7/2000 |
| EP | 1079462 | 2/2001 |
| EP | 1083624 | 3/2001 |
| EP | 1094545 | 4/2001 |
| EP | 1096602 | 5/2001 |
| EP | 1267438 | 12/2002 |
| EP | 1 515 392 | 3/2005 |
| GB | 2330951 | 5/1999 |
| GB | 2355116 | 4/2001 |
| JP | 55147806 | 11/1980 |
| JP | 5007109 | 1/1993 |
| JP | 5129816 | 5/1993 |
| JP | 5267916 | 10/1993 |
| JP | 5347507 | 12/1993 |
| JP | 6204908 | 7/1994 |
| WO | 9638881 | 12/1996 |
| WO | 9733338 | 9/1997 |
| WO | 9747054 | 12/1997 |
| WO | 9812771 | 3/1998 |
| WO | 9903166 | 1/1999 |
| WO | 9903167 | 1/1999 |
| WO | 97/06578 | 2/1999 |
| WO | 9925042 | 5/1999 |
| WO | WO-99/25044 | 5/1999 |
| WO | 9956345 | 11/1999 |
| WO | 0001028 | 1/2000 |
| WO | 0003453 | 1/2000 |
| WO | 0022695 | 4/2000 |
| WO | 0052787 | 9/2000 |
| WO | 0103238 | 1/2001 |
| WO | 0108257 | 2/2001 |
| WO | 0113464 | 2/2001 |
| WO | 0117064 | 3/2001 |
| WO | 0124314 | 4/2001 |
| WO | 0126182 | 4/2001 |
| WO | 0128035 | 4/2001 |
| WO | 0131739 | 5/2001 |
| WO | 0133665 | 5/2001 |
| WO | 0135491 | 5/2001 |
| WO | 0137369 | 5/2001 |
| WO | 0137370 | 5/2001 |
| WO | 0141252 | 6/2001 |
| WO | 0154225 | 7/2001 |
| WO | 0178192 | 10/2001 |
| WO | 02091518 | 11/2002 |
| WO | 02096166 | 11/2002 |

OTHER PUBLICATIONS

Romeu, Jordi et al., "A Three Dimensional Hilbert Antenna," IEEE, pp. 550-553 (2002).

Parker et al., "Microwaves, Antennas & Propagation," IEEE Proceedings H, pp. 19-22 (Feb. 1991).

H. Samavati, et al., "Fractal Capacitors", *IEEE Journal of Solid-State Circuits*, vol. 33, No. 12, Dec. 1998, pp. 2035-2041.

P. Pribetich, et al., "Quasifractal Planar Microstrip Resonators for Microwave Circuits", *Microwave and Optical Technology Letters*, vol. 21, No. 6, Jun. 1995, pp. 433-436.

D. Zhang, et al., "Narrowband Lumped-Element Microstrip Filters Using Capacitively-Loaded Inductors", *IEEE MTT-S International Microwave Symposium Digest*, May 16, 1995, pp. 379-382.

C.E. Gough, et al., "High Tc Coplanar Resonators for Microwave Applications and Scientific Studies", *Physica C, NL, North-Holland Publishing, Amsterdam*, vol. 282-287, No. 2001, Aug. 1, 1997, pp. 395-398.

Russian Patent Office Communication, with its English translation, from the corresponding Russian patent application dated May 20, 2003 (6 pgs.).

Radio Engineering Reference—Book by H. Meinke and F.V. Gundlah, vol. I, Radio components. Circuits with lumped parameters. Transmission lines. Wave-guides. Resonators. Arrays. Radio waves propagation, State Energy Publishing House, Moscow, with English translation (1961) [4 pgs.].

V.A. Volgov, Parts and Units of Radio Electronic Equipment (Design & Computation), Energiya, Moscow, with English translation (1967) [4pgs.].

Baliarda, Carles Puente, "Fractal Antennas", Dissertation, Electromagnetics and Photonics Engineering Group, May 1997, 283 pages.

Borja, C., et al; "Iterative Network Models to Predict the Performance of Sierpinski Fractal Antennas and Networks", Antennas and Propagation Society, IEEE, 1999, vol. 1, Jul. 11-16, 1999, pp. 652-655.

Cohen, Nathan; "Fractal Antennas Part I: Introduction and the Fractal Quad", Communications Quarterly, Summer 1995, pp. 7-22.

Sapoval et al, Acoustical properties of irregular and fractal cavities, The Journal of the Acoustical Society of America, Oct. 1997.

Sapoval, General formulation of laplacian transfer across irregular surfaces, Physical review letters, Dec. 1994.

Russ et al, Irregular and fractal resonators with Neumann boundary conditions—density of states and localization, Physical review letters, Feb. 1997.

Sapoval et al, Vibrations of strongly irregular or fractal resonators, Physical review letters, May 1993.

Sapoval, Transport across irregular interfaces—fractal electrodes, membranes and catalysts, Springer-Verlag, Jan. 1996.

Pribetich et al, A new planar microstrip resonators for microwave circuits: the quasi-fractal microstrip resonator, Microwave and optical technology letters, May 1999.

Lancaster et al, Superconducting filters using slow wave transmission lines, Advances in superconductivity. New materials, critical current and devices. Proceedings of the international symposium. New age int, New Delhi, India, 1996.

Lepage et al, Analysis of thin copper film planar lines with fractal structure for microwave circuits, Microwave and optical technology letters, Jul. 1996.

Peitgen et al, Chaos and fractals, Springer-Verlag, Feb. 1993.

Mandelbrot, The fractal geometry of nature, W. H. Freeman and Company, 1983.

Matthaei et al, Microwave filters impedance-matching networks and coupling structures, Artech House, 1980.

Cristal et al, Hairpin-line and hybrid hairpin-line / Half-wave parallel-coupled-line filers, IEEE Transactions on microwave theory and techniques, Nov. 1972.

Matthaei et al, Hairpin-comb filters for HTS and other narrow-band applications, IEEE Transactions on microwave theory and techniques, Aug. 1997.

Ishida et al, The electrical impedance of a continuously scaled fractal transmission line, Journal of Physics D: Applied physics, 1997.

Hong et al., A novel microwave periodic structure—the ladder microstrip line, Microwave and Optical Technology Letters, Jul. 1995, pp. 207-210, vol. 9, No. 4.

* cited by examiner 9.1

9.2

9.3

9.4

32.1  32.2

41.1  41.2

FRACTAL AND SPACE-FILLING TRANSMISSION LINES, RESONATORS, FILTERS AND PASSIVE NETWORK ELEMENTS

OBJECT OF THE INVENTION

This invention relates to high frequency electromagnetic circuits, in particular to those made on planar or quasi-planar substrates, where the circuit is patterned on a metallic or superconducting film on top of a dielectric in any of the configurations known to those skilled in the art (for instance micro-strip, strip-line, co-planar, parallel plate or slot-line configurations). A part of the circuit such as the characteristic strip or slot of the configurations is shaped in a novel space-filling geometry which allows a significant size reduction of the circuit component. Miniature transmission lines, capacitors, inductors, resistors, filters and oscillators can be manufactured this way.

The invention is preferably applicable to the telecommunications field and more specifically to high frequency electromagnetic circuits.

BACKGROUND

There are many applications where planar circuits are used which would benefit from a reduction in the circuit size. This is the case, for example, in aerospace applications and mobile communication systems where weight and volume of the equipment is severely restricted. This reduction is also desirable when the cost of a substrate (the dielectric and metals or superconductors covering it) is expensive.

SUMMARY OF THE INVENTION

The key point of the invention is shaping part of the planar circuit (transmission lines, capacitors, resistors, inductors, resonators and filters) as a Space-Filling Curve (hereafter SFC), that is, a curve that is large in terms of physical length but small in terms of the area in which the curve can be included. More precisely, the following definition is taken in the present document for a space-filling curve: a curve composed by at least ten segments which are connected in such a way that each segment forms an angle with their neighbours, that is, no pair of adjacent segments define a larger straight segment. The space-filling curve can be fitted over a flat or curved surface, and due to the angles between segments, the physical length of the curve is always larger than that of any straight line that can be fitted in the same area (surface) as the space-filling curve. Also, whatever the design of such SFC, it can never intersect with itself at any point except the initial and final point (that is, the whole curve can be arranged as a closed curve or loop, but none of the parts of the curve can become a closed loop). When applying the SFC geometry to shape the planar circuit, it must be taken into account that the segments must be smaller than a tenth of the operating free-space wavelength.

Depending on the shaping procedure and curve geometry, such space-filling curves can be designed to feature a Haussdorf dimension (for a precise definition of Haussdorf dimension see for instance H. O. Peitgen, H. Jürgens, D. Saupe, Chaos and Fractals, Springer-Verlag, New York, 1992) larger than their topological-dimension. That is, in terms of the classical Euclidean geometry, it is usually understood that a curve is always a one-dimension object; however when the curve is highly convoluted and its physical length is very large, the curve tends to fill parts of the surface which supports it; in that case the Haussdorf dimension can be computed over the curve (or at least an approximation of it by means of the box-counting algorithm) resulting in a number larger than unity. The curves in FIG. 1 and FIG. 3 are some examples of such SFC, featuring a dimension $D \approx 2$.

Some particular cases of the SFC curves are often referred as "fractal" curves (see for instance B. B. Mandelbrot, The Fractal Geometry of Nature, W.H. Freeman and Company, 1983). The term fractal describes a whole family of geometries (including sets of dots, curves, surfaces, . . . ) which usually feature the self-similarity property, that is, each part of the geometrical object is a replica of the whole object at a different scale. Strictly speaking a fractal curve is an ideal mathematical abstraction that has an infinite length, therefore in practice a true fractal curve cannot be physically constructed. At most, some fractal shapes can be approached with other non-fractal objects, for instance by means of the space-filling curves described above, or by means of a multilevel structure (PCT/ES99/00296). For the sake of clarity, the term Fractal Space-Filling Curve (FSFC) is used in the present description to name any of the SFC that substantially approach an ideal fractal shape.

The advantage of using SFC, fractal or FSFC curves in the physical shaping of the circuital components is two-fold:

(a) Given a particular operating frequency or wavelength and a characteristic feature of the circuit component (the inductance of the inductor, the capacitance of the capacitor, the resistance of the resistor, the electrical length of the transmission line and so on), the circuit component can be reduced in size with respect to the prior art.

(b) Given the physical size and the characteristic feature of the component, the component can be operated at a lower frequency (a longer wavelength) than the prior art.

The size reduction of the circuit components by means of the present technique contributes with other significant benefits: superconducting materials can become a cost-effective solution in the construction of the network elements due to size reduction; by using superconducting materials in the construction of transmission lines, resonators and filters, the insertion-loss is reduced and the quality factor of such devices is increased. By increasing the quality factor of resonators and filters in the transmitters and/or receivers of any telecommunication system, an improved performance is achieved in several aspects: the signal to noise ratio is enhanced (i.e., the quality of the telecommunication system), and the frequency spacing between adjacent channels can be reduced. The adjacent channel spacing reduction implies a more efficient use of the available spectrum, such that telecommunication operators can increase their network capacities (a higher density of users in cellular telephone systems, a higher information rate and traffic density in either data, voice or video signal transmission).

BRIEF DESCRIPTION OF THE DRAWINGS

In the figures, the same reference numerals have been used to indicate corresponding elements or features.

DETAILED DESCRIPTION OF THE PREFERRED EMBODIMENTS

The present invention relates to miniaturization techniques of planar electromagnetic circuits, with an emphasis on circuits containing resonators such as filters and oscillators. As described below, these techniques can also be used to reduce the size of individual components within a planar circuit, even though the overall function of the circuit might not be that of a filter. Novel types of geometries are proposed to pattern the circuits and components, so that an efficient use of substrate space is made.

Figure 18:
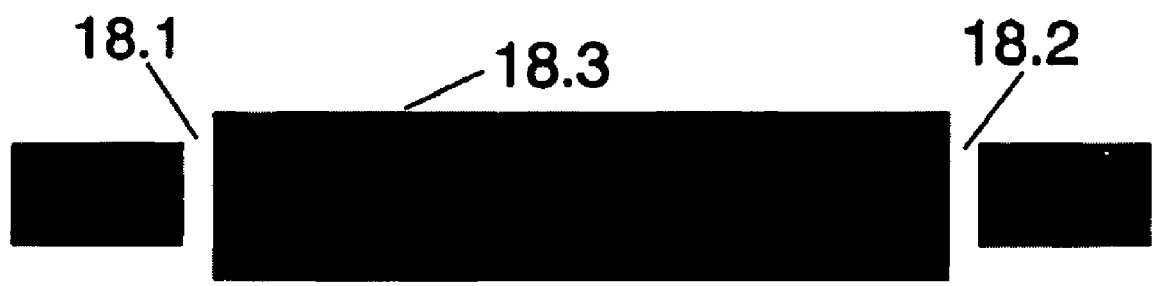
FIG. 18 shows a conventional two-port resonator in which the resonant element is a straight, half-wave microstrip transmission line, and the input and output ports are coupled with capacitive gaps at the edges of the resonant line.
Figure 20:
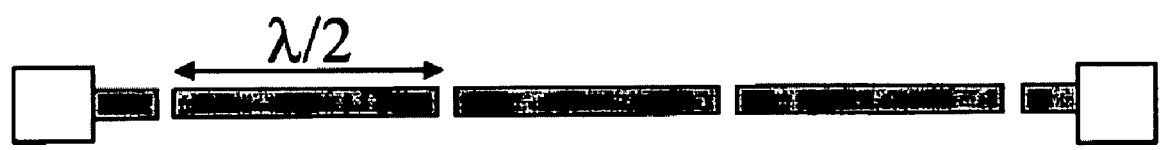
FIG. 20 is a conventional microstrip filter comprising several edge-coupled, half-wave straight microstrip line resonators.
Figure 31:
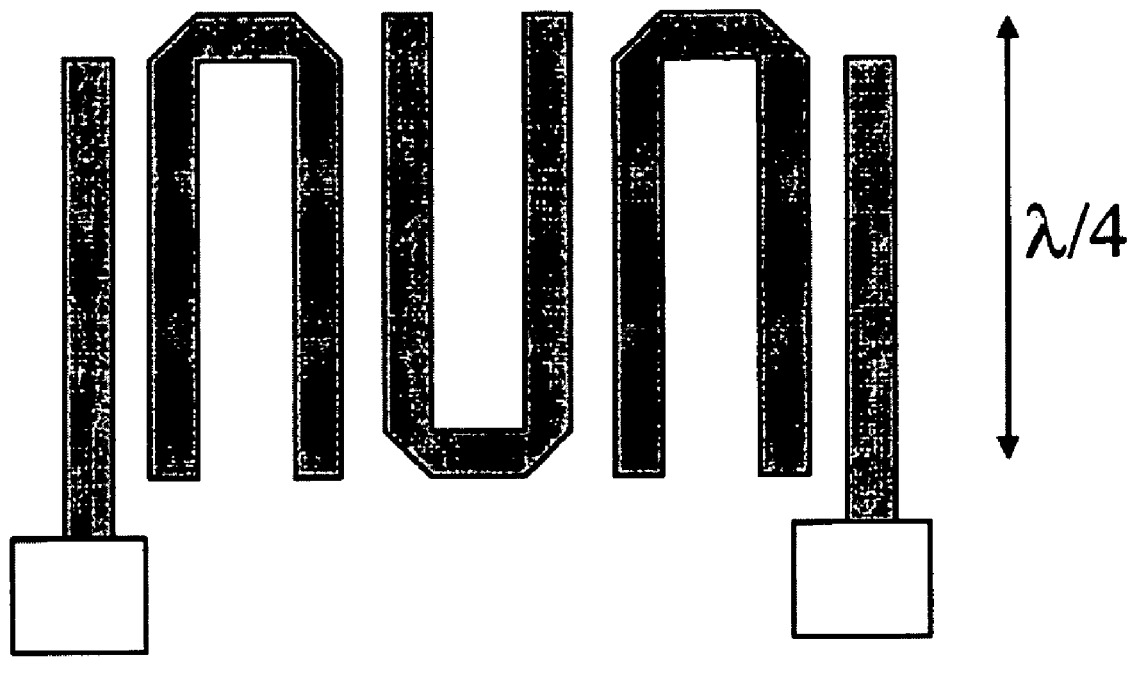
FIG. 31 shows a conventional hairpin filter. It is an evolution of a parallel-coupled, straight-line filter in which the line resonators are folded.

FIG. 18 shows the layout of a standard, two-port microstrip resonator (prior art) used in planar microwave and RF circuits. This is also the simplest form of a microwave planar filter, since signal transfer between the input and output port occurs only at frequencies close to the half-wave resonance of the open-circuited microstrip line. More elaborate filter designs couple several resonant lines, and there are many design alternatives as described in GL Matthaei, L Young, EMT Jones, Microwave Filters, Impedance-Matching Networks and Coupling Structures. Artech House, Dedham, Mass. 1980. For example, FIG. 20 represents a multipole planar filter made by coupling several resonant lines through their ends (prior art). Although more space-efficient filter layouts exist, this figure clearly shows that there is a tradeoff between the number of resonators in a filter and the surface that it takes in the planar substrate. Furthermore, since the number of resonators in a filter determines its frequency selectivity and the ripple in its passband, this number is not a parameter that is likely to be changed for the sake of a reduced filter size. The present invention provides some geometries to efficiently fold and coil the resonators in filters with coupled-line resonators (as the ones in FIGS. 18 and 20, among many other filter topologies), so that an efficient use of the substrate space is made. This allows for a high number of resonators to be used in a planar filter. Some preliminary attempts to fold the resonant lines within a filter have been reported in various published works, a clear example being the Hairpin filters described in E. G. Crystal, S. Frankel "Hairpin-Line and Hybrid Hairpin-Line/Half-Wave Parallel-Coupled-Line Filters", IEEE Trans on Microw. Theor. and Tech. Vol. 20, No. 11, November 1972 pp. 719-728 (FIG. 31). These are essentially typical half-wave parallel-coupled-line filters in which the line resonators are folded in half. However, the folding schemes used there are not the most efficient way of reducing the size of the device. Instead, in this invention, alternative shaping procedures using multiple line segments arranged in novel space-filling geometries are introduced.

As an example of the need in improving the miniaturization techniques described in the prior art, some modifications to the original design of the Hairpin filter have already been described in the technical literature. For example, G. L. Matthaei, N. O. Frenzi, R. J. Forse and S. M. Rohlfing in "Hairpin-Comb Filters for HTS and Other Narrow-Band Applications", IEEE Trans on Microw. Theor. and Tech. Vol. 45, No. 8, August 1997 pp. 1226-1231, use the modified Hairpin resonator of FIG. 32.1 in which the size of the resonator is modified by introducing capacitive coupling between its ends by means of a straight slot. Following the spirit of the present invention, a further reduction of the size of the resonator is proposed by replacing the straight coupling slot with the more convoluted geometries disclosed in this document. An even further reduction would be obtained by also replacing the U-shaped strip by the geometries disclosed herein.

Another known technique for reducing the filter size is to use slow-wave transmission lines or other related slow-wave guiding structures instead of the standard lines in the resonators of the filter. This reduces the length of the line resonators used in the filter. A prior art example of slow-wave line is the ladder line described by J. S. Hong and M. J. Lancaster in "Superconducting Filters Using Slow Wave Transmission Lines", Microwave and Optical Technology Letters, Vol. 9, No. 4, July 1995, pp. 207-210 (FIG. 22), in which the solid strip conductor of a typical microstrip line is replaced by a ladder-like structure. This significantly reduces the propagation velocity in the ladder line with respect to that of a standard microstrip line. The reduction in velocity is due to the high inductance of the two long, parallel strips (the handle bars in the ladder), and the high capacitance provided by the multiple parallel strips connecting them (the steps in the ladder).

The geometrical shapes covered in the present invention can also be used to produce slow-wave transmission lines and guiding structures, and to further reduce the velocity of propagation (and thus, size) of prior art topologies of slow-wave lines. For example, the straight-line step-like strips in FIG. 22 can be substituted for the more convoluted geometries of this invention to further reduce the velocity of propagation.

Another known filter miniaturization technique is the use of dual and degenerate resonant modes as described, among many other references, by S. L. Fiedziuszko, J. A. Curtis in U.S. Pat. No. 5,172,084. This patent is based on resonant structures made of microstrip ring resonators. More compact resonators, also supporting dual modes, can be built using the geometries proposed in the present invention.

Not all planar filters are made by coupling structures that show an electromagnetic resonance within the passband of the filter. For example, D Zhang, G-C Liang, CF Shih, RS Withers in "Narrowband Lumped-Element Microstrip Filters Using Capacitively—Loaded Inductors" (1995 MTT-S Symposium Digest. Orlando, Fla., May 1995. pp. 379-382 vol. 2) present a filter whose passband frequencies are well below the resonant frequencies of the resonators used. These filters need reactances to implement the resonators and to provide coupling among the resonators. These reactances can also be made smaller by using the geometries of the present invention. For example, in the paper by Zhang et al, interdigitated capacitances are used in the resonators. These capacitances consist in a meander-shaped slot separating two strips. A reduction in the size of these resonators would be obtained if the meander was replaced by the more convoluted geometries disclosed in the present invention. This is only a very specific example of where the geometries can be applied to the miniaturization of reactive components in planar circuits. The invention is applicable wherever planar reactances are needed. This includes all types of filters (beyond the various types of filters described above), and any other circuit using DC blocks, RF chokes, capacitances, inductances or resonators.

Some particular cases of the geometries used in the present invention were mathematically described at the end of the nineteenth century. Several mathematicians such as Georg Cantor, Giusepe Peano, David Hilbert, Helge von Koch and Waclaw Sierpinski described the construction of several curves and structures that inspire some of the designs showed in the present description. More recently, Benoit Mandelbrot (B. B. Mandelbrot, The Fractal Geometry of Nature, W.H.Freeman and Co., New York, 1982) coined the term "fractal" and introduced many other particular cases of similar geometries. In all these cases the curves were studied from the mathematical point of view but were never used for any practical engineering application.

The most common way of designing fractal shapes is by means of an Iterated Function System (IFS) geometric algorithm (sometimes also known as Multi Reduction Copy Machine, MRCM). In some other cases networks of IFS or MRCM algorithms are used as well (the resulting algorithms are named NMRCM in those cases).

These algorithms are based on Hutchinson operators. A Hutchinson operator is a set of linear transformations. In the case of a flat structure, the linear transformations are mathematically described as $$x_n = (r \cos \phi) x_{n-1} - (s \sin \Psi) y_{n-1} + x_0$$

$$y_n = (r \sin \phi) x_{n-1} + (s \cos \psi) y_{n-1} + y_0$$

where $(x_{n-1}, y_{n-1})$ are the coordinates of the points of an input set $A_{n-1}$, $(x_n, y_n)$ are the points of an output set $A_n$, $(x_0, y_0)$ define a translation transformation, r and s are real numbers corresponding to scaling factors, and $\phi$ and $\psi$ define rotation transformations. Each linear transformation of a Hutchinson operator is characterized by the parameters r, s, $\phi$ and $\psi$ plus the translation to $(x_0, y_0)$. A Hutchinson operator is characterized by its set of linear transformations.

An IFS algorithm is an iterative procedure that consists in a first stage on applying a characteristic Hutchinson operator to an input set of points A0 to obtain an output set of points A1, and to keep applying the same Hutchinson operator to the output a number N of times (stages of the procedure) until a set of points AN is obtained. Strictly speaking, to generate a fractal shape the IFS algorithm has to be applied an infinite number of times; also, the designer has to properly choose the linear transformations that compose the Hutchinson operator that characterizes the IFS algorithm. In a more complex procedure, several Hutchinson operators are applied at each stage and also several initial sets of points are used (for instance to generate the Hilbert and SZ curves described in FIG. 1 and FIG. 3 respectively); in this case, the term NMRCM is used to described the procedure. Both IFS (MRCM) and NMRCM procedures are well known to those skilled in the field of fractal mathematics; a more detailed discussion of their application to generate fractal structures is found in H. O. Peitgen, H. Jürgens, D. Saupe, Chaos and Fractals, Springer-Verlag, 1992.

A precise fractal structure or curve is a mathematical abstraction and cannot be physically implemented since this requires an infinite number of iterations. In the present invention, some of the characteristic curves and structures used to shape some parts of the claimed electromagnetic devices are generated using the IFS and NMRCM algorithms with a finite number of stages N.

The dimension (D) is often used to characterize highly convoluted geometrical curves and structures such as those described in the present invention. There are many different mathematical definitions of dimension (see for instance a discussion of this topic in H. O. Peitgen, H. Jürgens, D. Saupe, Chaos and Fractals, Springer-Verlag, 1992), but in the present document the box-counting dimension (which is well-known to those skilled in mathematics theory) is used to characterize a family of designs.

A first attempt to use fractal geometry to construct a resonator is described in WO97/06578. The use of a fractal-shaped helical or spiral coil as an inductor together with a conventional capacitor to form a resonator was described there. As it can be readily seen by those skilled in the art, the present invention is essentially different from the particular case described in WO97/06578 for several reasons:

(a) The present invention includes the description of many network elements (capacitors, transmission lines, filters, resonators, inductors, resistors) that are not disclosed in WO97/06578.
(b) The present invention describes the construction of distributed resonators and filters comprising distributed transmission lines and other distributed structures that do not require the use of a lumped inductor and a lumped capacitor to form the resonator.
(c) Fractal and space-filling curve based planar capacitors are described in the present document which are previously non-disclosed inventions.
(d) For the cases of the present invention where resonators are formed with lumped inductors and capacitors, the inductors are constructed in a planar form by means of non-intersecting curves and using geometries (space-filling curves and Hilbert, Peano and SZ curves as it is clearly detailed in the following sections) which are substantially distinct to those described in WO97/06578.
(e) In those cases where the term "fractal" is used in the present invention, it is done in a different way than in WO97/06578; in particular a different definition of fractal dimension is used here (the Haussdorf and the box-counting dimension) as well as a different construction of the fractal curves. The curves used in the present invention (such as the Hilbert and SZ curves) require different construction mechanisms such as NMRCM algorithms that are not included in WO97/06578.

The designs here should not be confused with other previously disclosed works such as M. Ishida, R. Mill "The electrical impedance of a continuously scaled fractal transmission line", J. Phys. D: Appl. Phs.30 (1997) (pages 1157-1163). Such a theoretical scientific work analyses the theoretical behavior of a conceptual transmission line that features a fractal characteristic impedance (not a fractal-like geometry of the transmission line as it is introduced here); the work is an abstraction and does not describe the physical construction of any transmission line, and of course, it does not describe any use of said imaginary device either.

A co-planar slow-line loaded by means of a convoluted planar capacitor is already described in M. J. Lancaster, F. Huang, A. Porch, J. S. Hong and D. Hung, "Superconducting Filters Using Slow-Wave Transmission Lines" Advances in Superconductivity. New Materials, Critical Current and Devices. Proceedings of the International Symposium. New Age Int, New Delhi, India; 1996 pp. 180-185, which in fact can be seen as a particular case of one of the slow-line co-planar structures described herein. Nevertheless, those skilled in the art will notice that the designs in the present invention are based on different curves and geometries (such as the Hilbert and SZ curve) not previously disclosed that can be used to further reduce the size of the slow-line.

Figure 1:
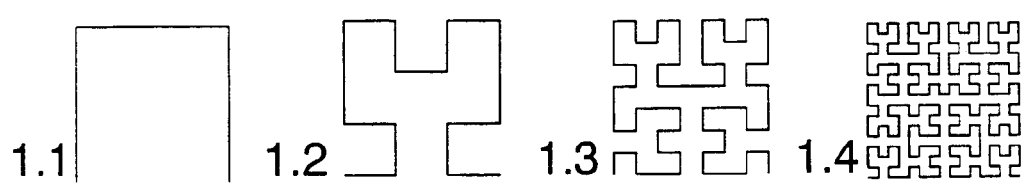
FIG. 1 shows some particular examples of space-filling curves.
Figure 1:
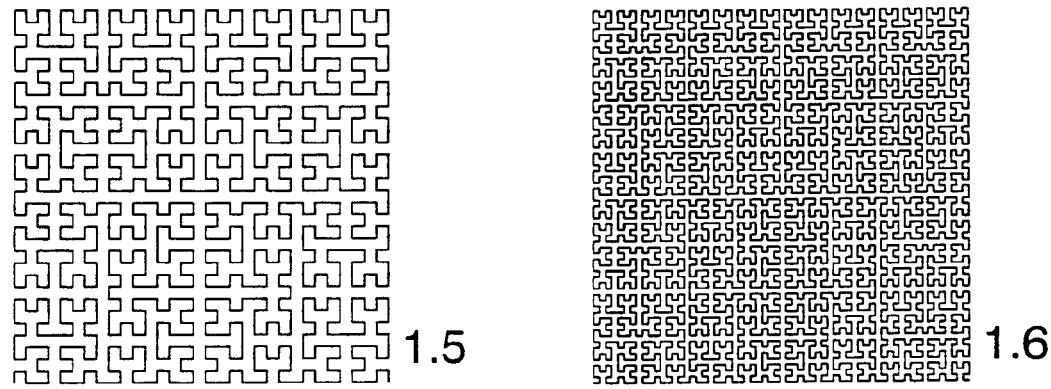
Figure 1:
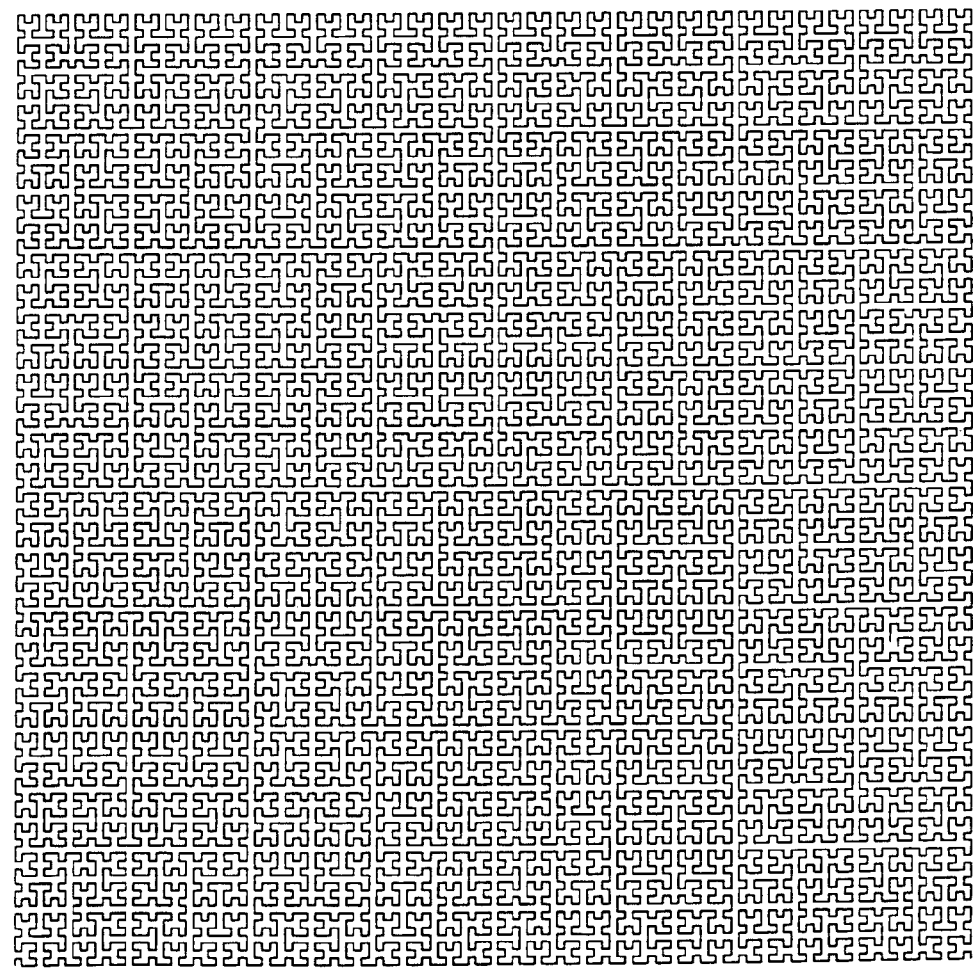

FIG. 1 shows some particular examples (1.2-1.7) of space-filling curves. Curve (1.1) is made of 3 segments. Curve (1.2) is made of 13 segments, curve (1.3) is made of 52 segments, curve (1.4) is made of 208 segments, curve (1.5) is made of 832 segments, curve (1.6) is made of 3328 segments and (1.7) is made of 13312 segments. These curves can be constructed with an NMRCM algorithm and approximate the shape of the ideal Hilbert curve as it is described in the literature.

Figure 2:
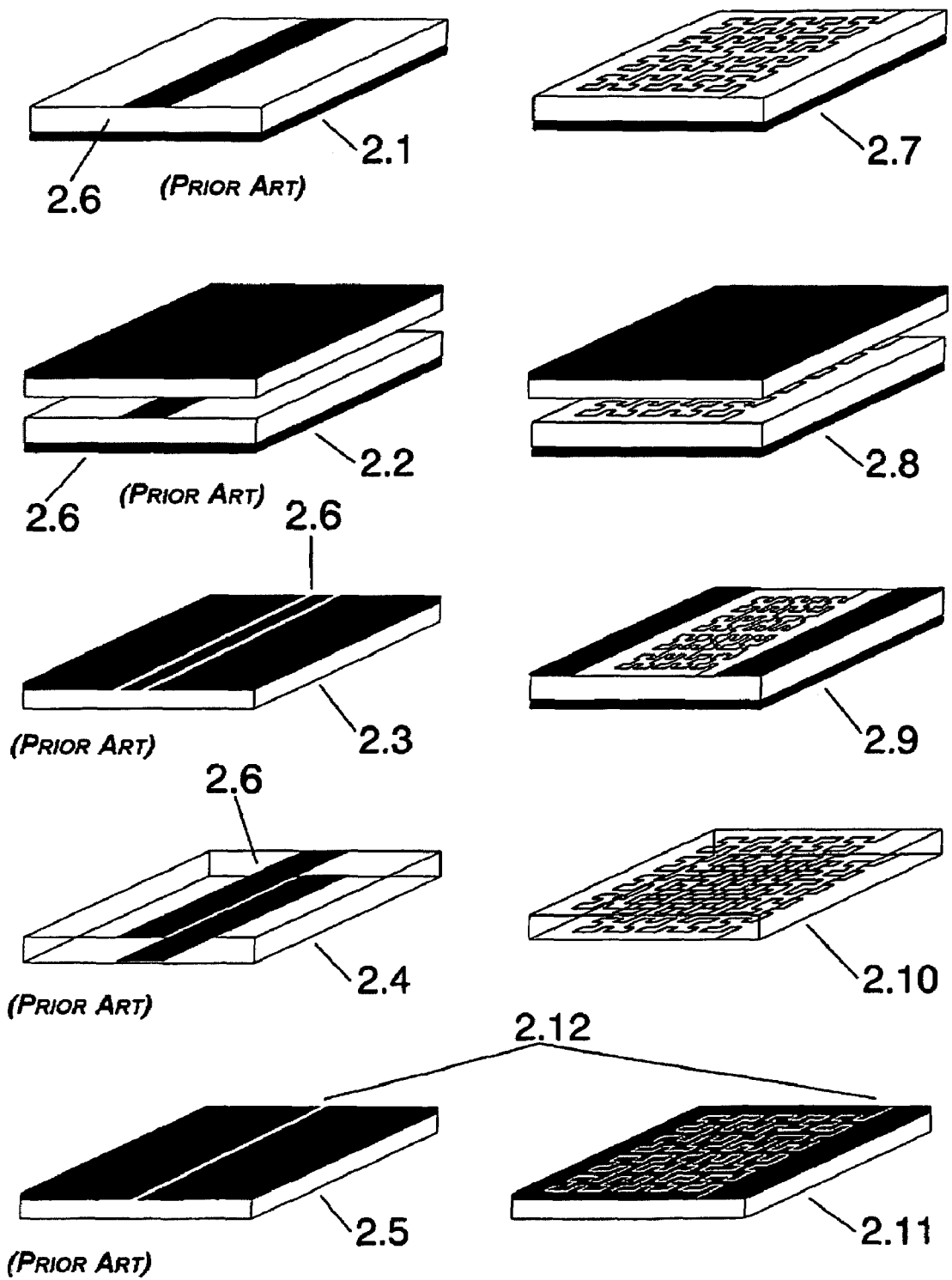
FIG. 2 shows several configurations of conventional transmission lines of the prior art, and some particular embodiments of SFC transmission lines.

FIG. 2 shows several configurations of conventional transmission lines (prior art): a micro-strip (2.1), a strip-line (2.2), a co-planar line (2.3) and a parallel plate line (2.4) with their characteristic conducting strips (2.6), and a slot-line (2.5) characterized by the slot (2.12) between the two conducting or superconducting strips. In the right column, some particular embodiments of SFC transmission lines based on the SFC (1.4) are represented (micro-strip (2.7), strip-line (2.8), co-planar (2.9), parallel plate (2.10) and slot-line (2.11)).

Figure 3:
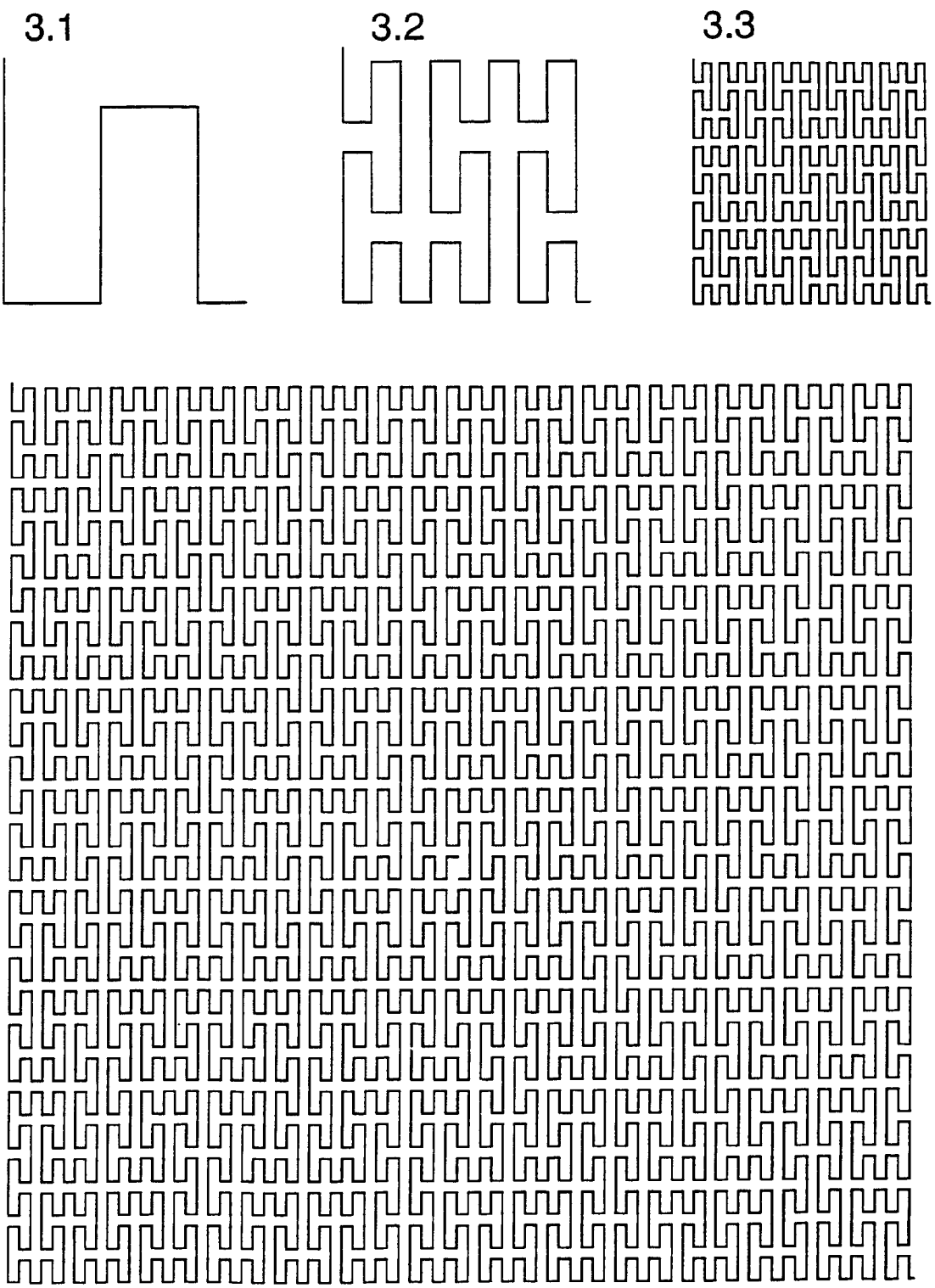
FIG. 3 shows a set of space-filling curves known as SZ curves.

FIG. 3 shows a set of space-filling curves known as SZ curves. The curves can be constructed by means of a NMRCM procedure from two sets of points based on curve (3.1) as it is described in several mathematics treatises. Notice that curves (3.2), (3.3), and (3.4) have been constructed with more than ten connected straight segments.

Figure 4:
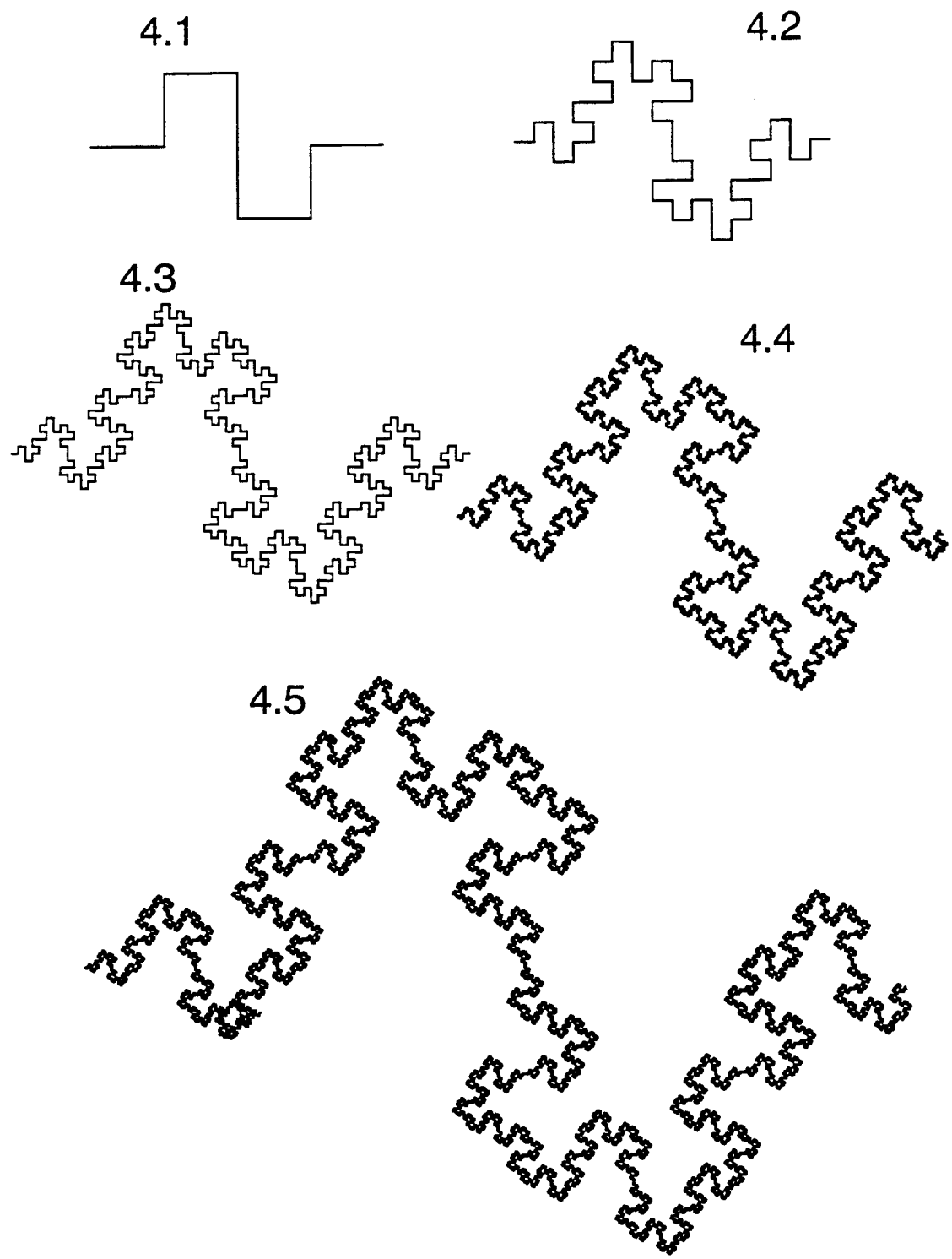
FIG. 4 shows a set of space-filling curves named as ZZ curves.

FIG. 4 shows a set of space-filling curves named as ZZ curves. The curves can be constructed by means of a characteristic IFS algorithm. Curve (4.1) has been constructed with seven straight segments. Notice that curves (4.2), (4.3), (4.4) and (4.5) have been constructed with more than ten connected straight segments.

Figure 5:
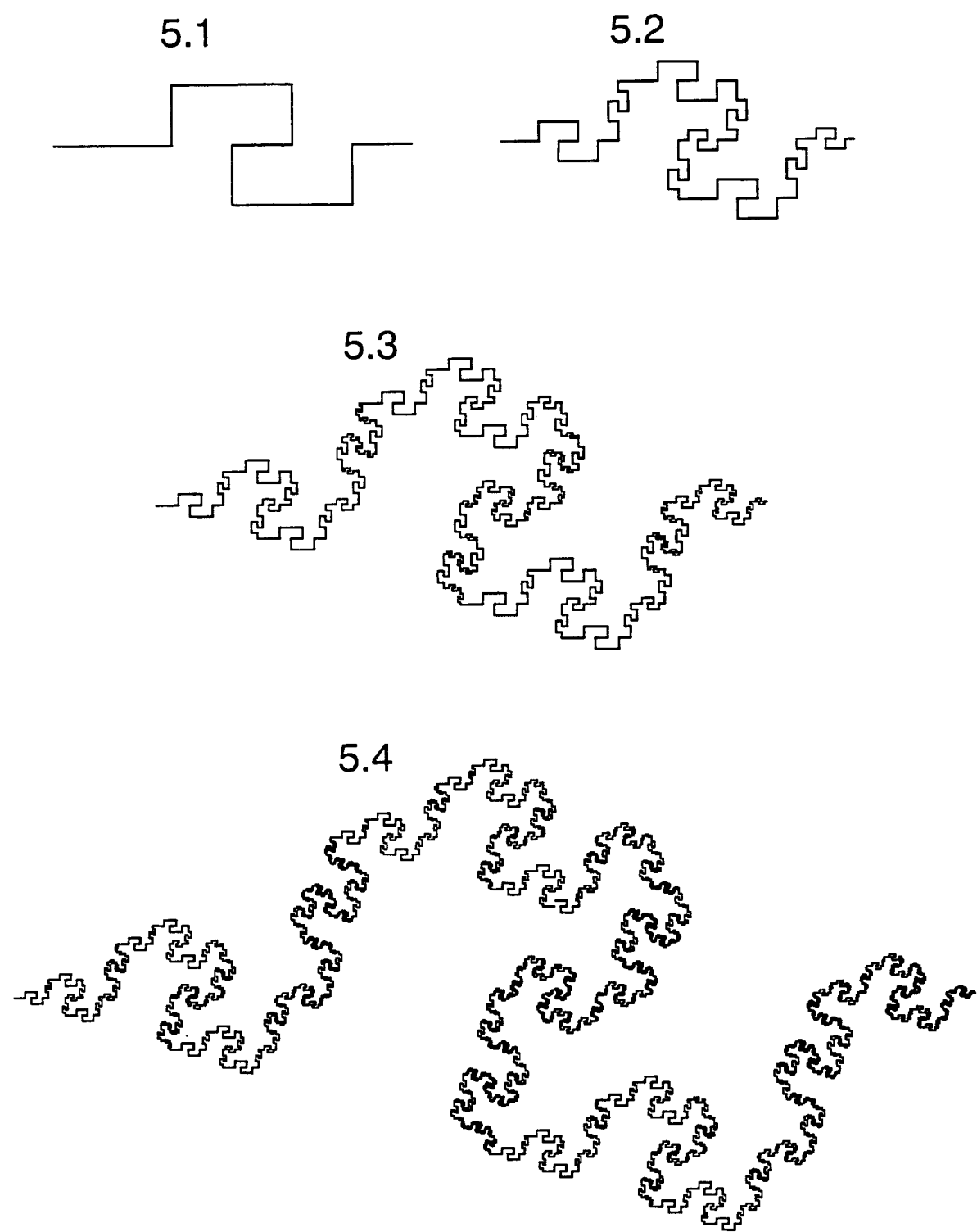
FIG. 5 shows a set of space-filling curves based on the Peano curve.

FIG. 5 shows a set of space-filling curves based on the Peano curve. The curves can be constructed by means of a characteristic IFS algorithm as it is described in the literature. Curve (5.1) has been constructed with nine straight segments. Notice that curves (5.2), (5.3), and (5.4) have been constructed with more than ten connected straight segments.

Figure 6:
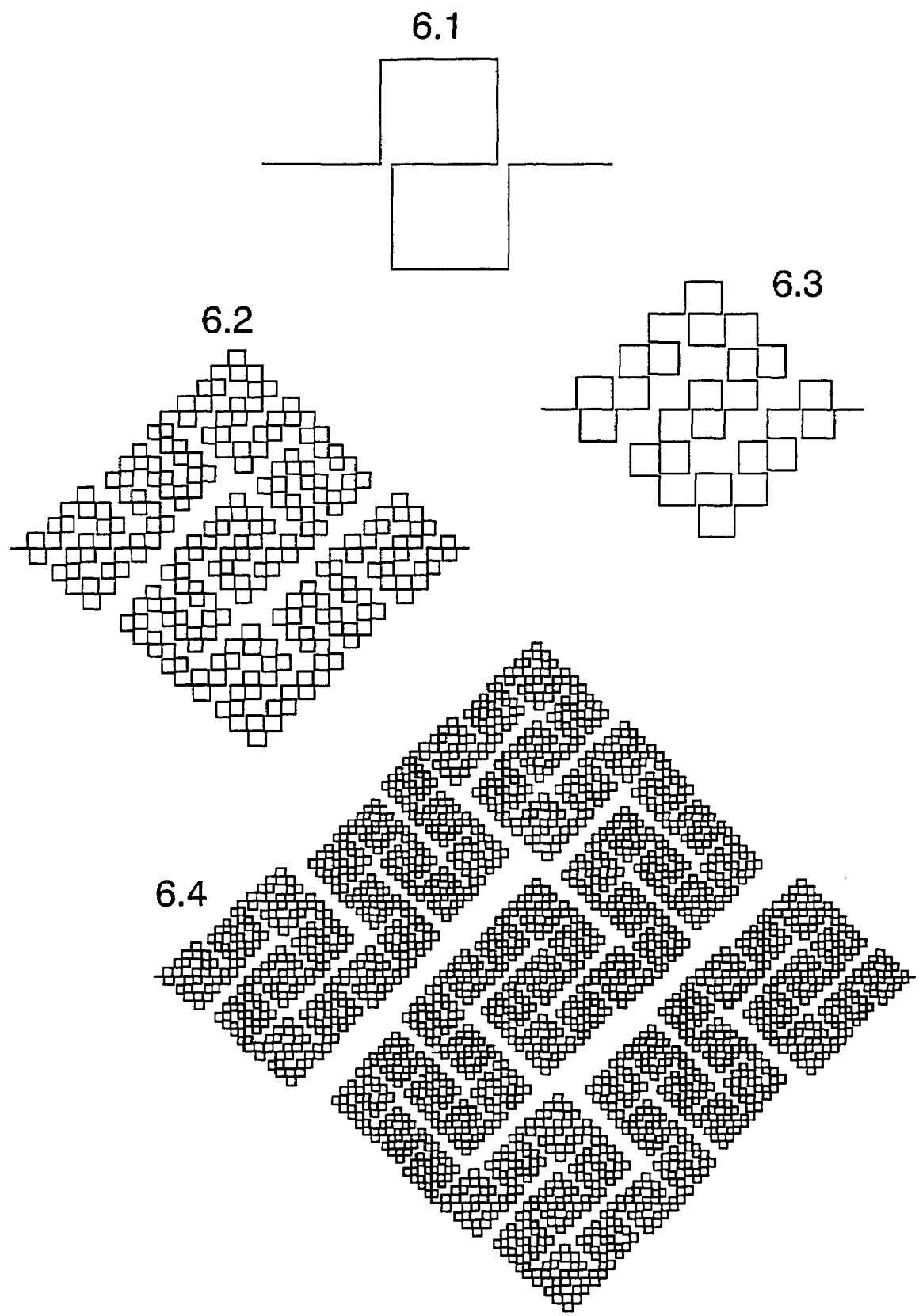
FIG. 6 also shows a set of space-filling curves based on the Peano curve.

FIG. 6 shows a set of space-filling curves based on the Peano curve. As it is clear to those skilled in this art of mathematics, the curves can be constructed by slightly modifying the characteristic IFS algorithm used in the construction of curves in FIG. 5. Curve (6.1) has been constructed with nine straight segments. Notice that curves (6.2), (6.3), and (6.4) have been constructed with more than ten connected straight segments.

Figure 7:
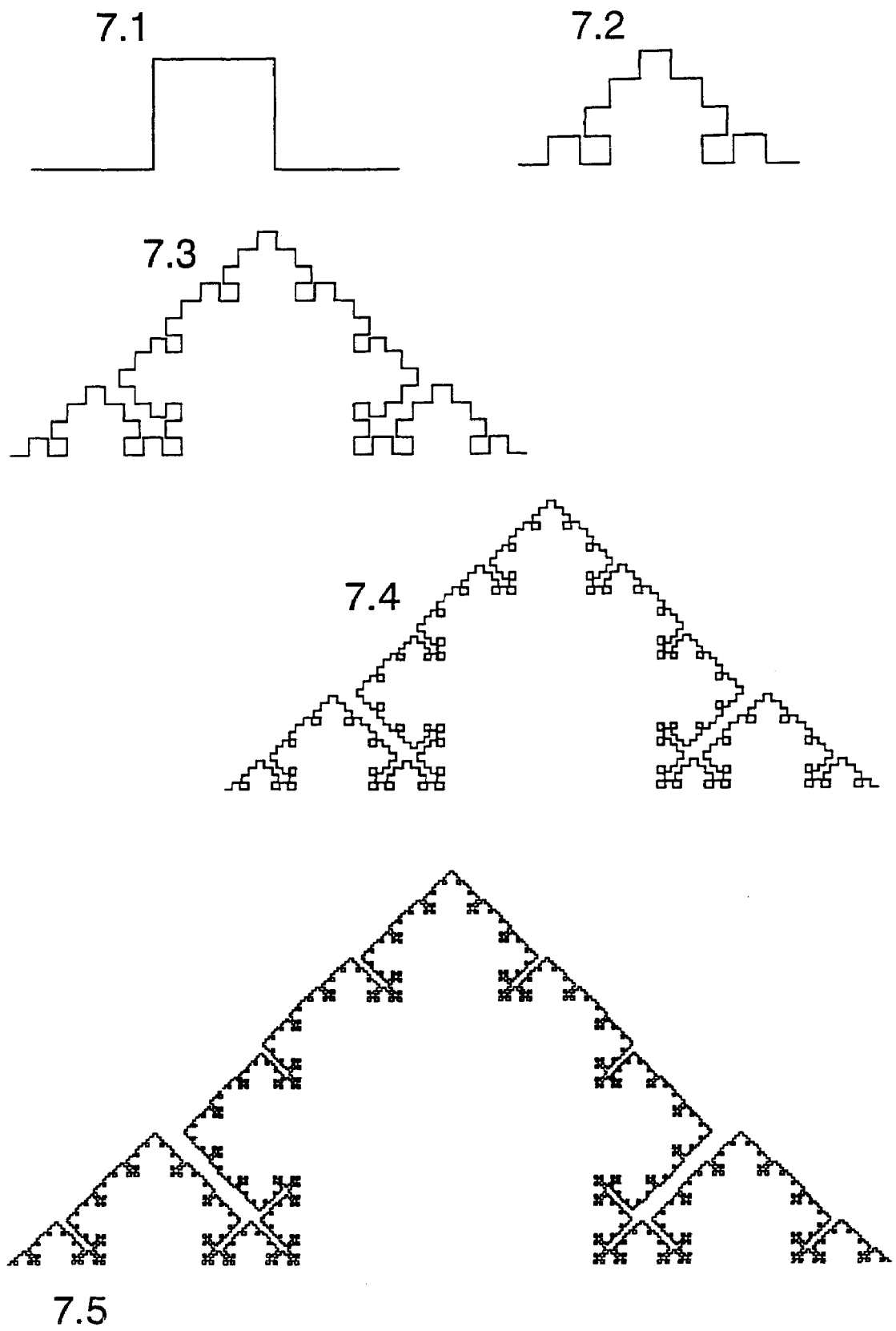
FIG. 7 shows a set of space-filling curves based on the Minkowski curve.

FIG. 7 shows a set of space-filling curves based on the Minkowski curve. The curves can be constructed by means of a characteristic IFS algorithm. Curve (7.1) has been constructed with five straight segments. Notice that curves (7.2), (7.3), (7.4) and (7.5) have been constructed with more than ten connected straight segments.

Figure 8:
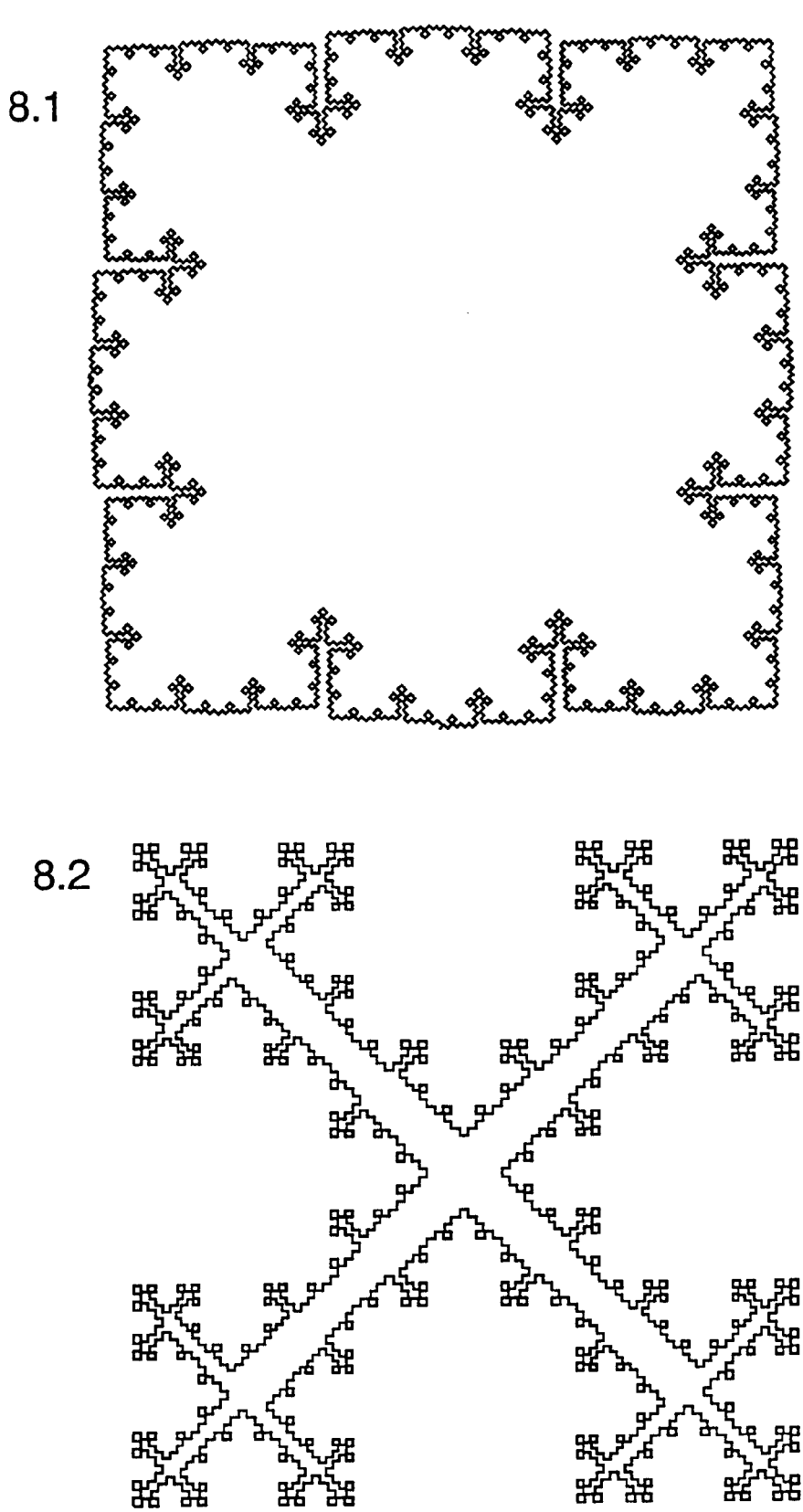
FIG. 8 shows two examples of loop curves constructed by connecting several space-filling curves as curves in FIG. 7.

FIG. 8 shows two examples of loop curves (8.1, 8.2) constructed by connecting several space-filling curves as curves in FIG. 7. As it is clear to those skilled in the art of mathematics, a similar procedure can be applied to other space-filling curves as the particular cases described in FIGS. 1 through 9.

Figure 9:
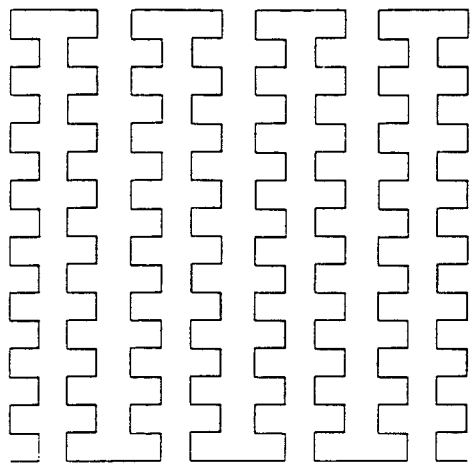
FIG. 9 shows some particular cases of space-filling curves named as HilbertZZ curves.
Figure 9:
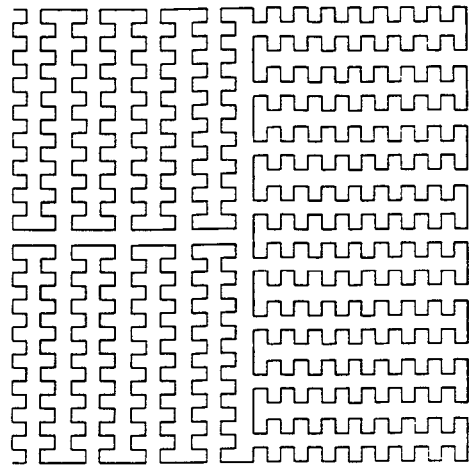
Figure 9:
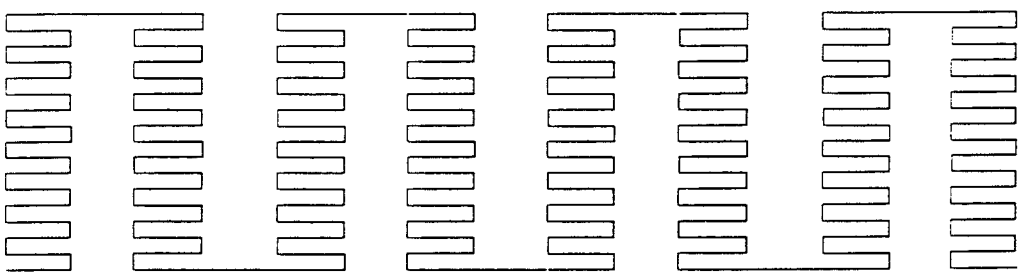
Figure 9:
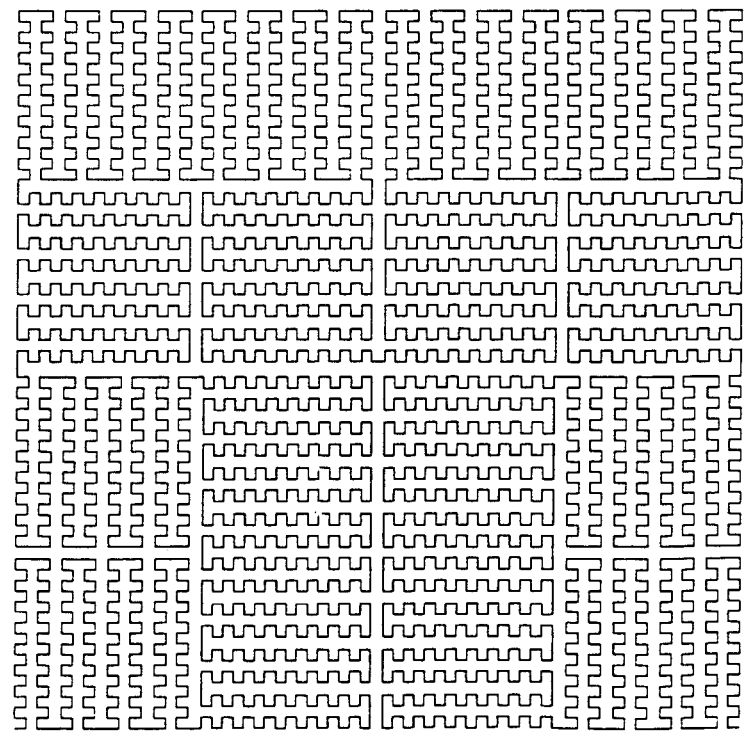

FIG. 9 shows some particular cases of space-filling curves (9.1, 9.2, 9.3, 9.4) named as HilbertZZ curves. They are clearly defined as space-filling curves and they cannot be constructed after a simple IFS (or MRCM) algorithm.

Figure 10:
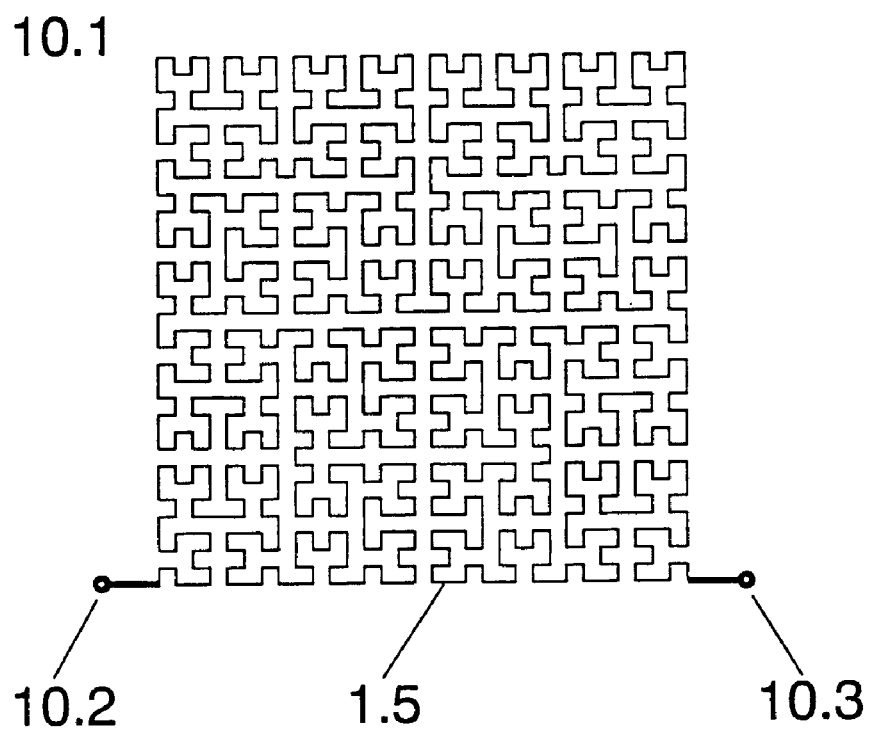
FIG. 10 describes a particular use of a particular case of SFC curve following the spirit of the present invention.
Figure 10:
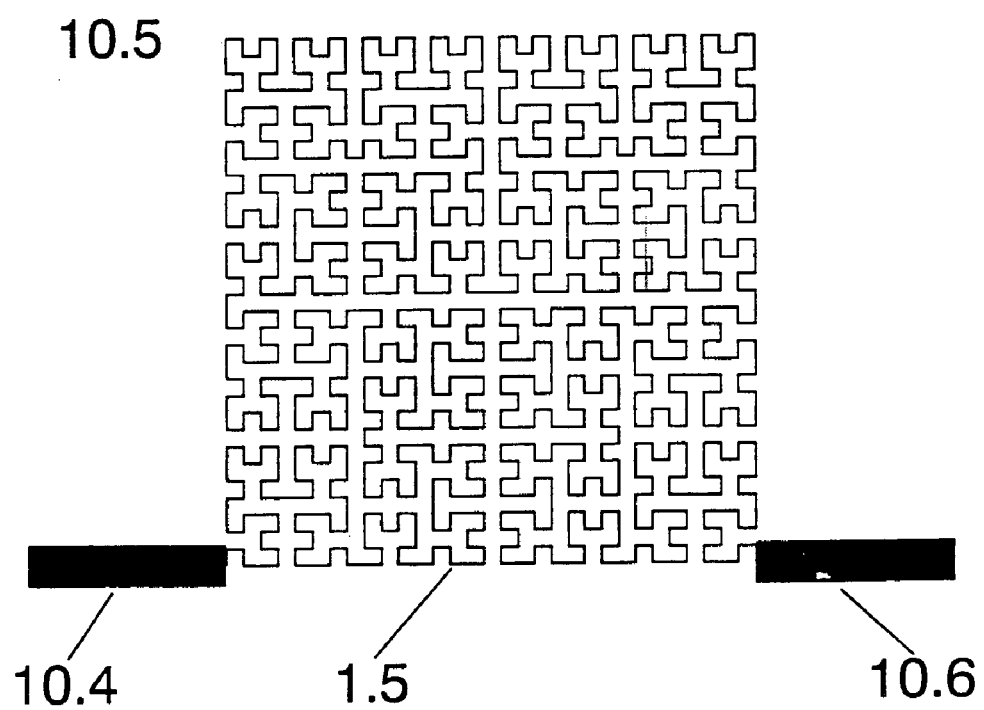

FIG. 10 describes a particular use of a particular case of SFC curve following the spirit of the present invention. The Hilbert curve (1.5) is used to shape the characteristic strip of a microwave transmission line (10.1, 10.5). The two tips of the curve form the input (10.2) and output (10.3) of the transmission line, that can be connected to other strips as for instance (10.4) and (10.6). The strip based on the Hilbert curve (1.5) can be used to shape any of the well-known transmission-line configurations described in the prior art, drawings (2.1-2.5), according to the spirit and scope of the present invention. As it will be readily apparent to those skilled in the art, a Hilbert curve is shown here as a particular example but any other space-filling curves can be used within the spirit and scope of the present invention.

Figure 11:
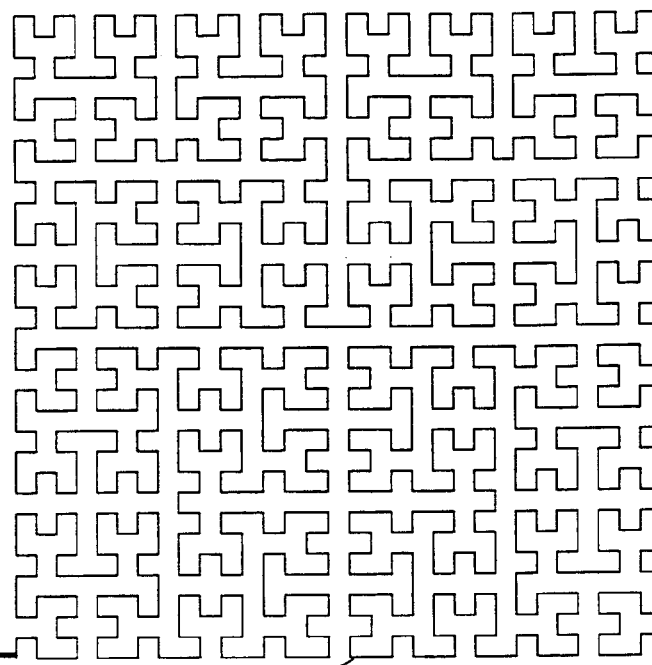
FIG. 11 describes a particular embodiment of a SFC transmission-line.
Figure 11:
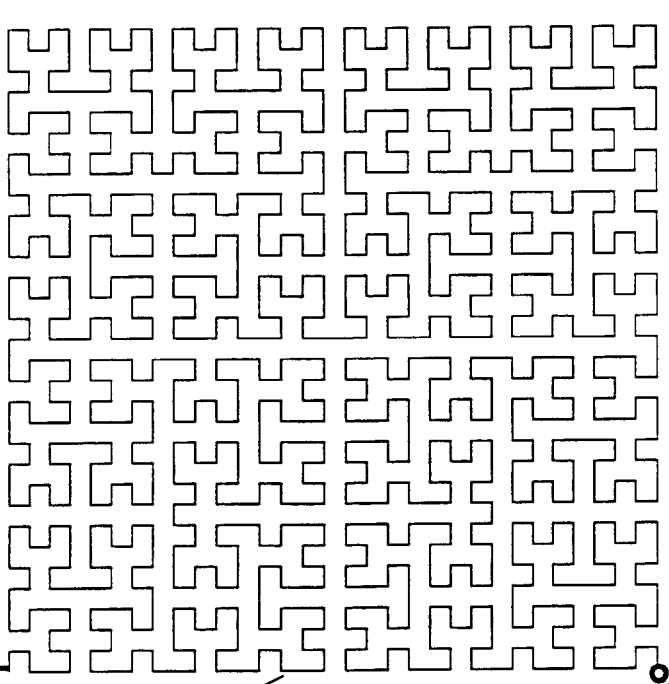

FIG. 11 describes a particular embodiment of a SFC transmission-line (11.1, 11.4). The transmission line is terminated with either a short-circuit (11.3) or an open circuit (11.7) having respective inputs (11.2, 11.5). A one-port device is formed this way, wherein the device operates as a resonator, a capacitor or an inductor depending on the operating frequency as it is clear to those skilled in the art. As it is apparent to those skilled in the art, a Hilbert curve (1.5) is shown here as a particular example but any other space-filling curves can be used within the spirit and scope of the present invention.

Figure 12:
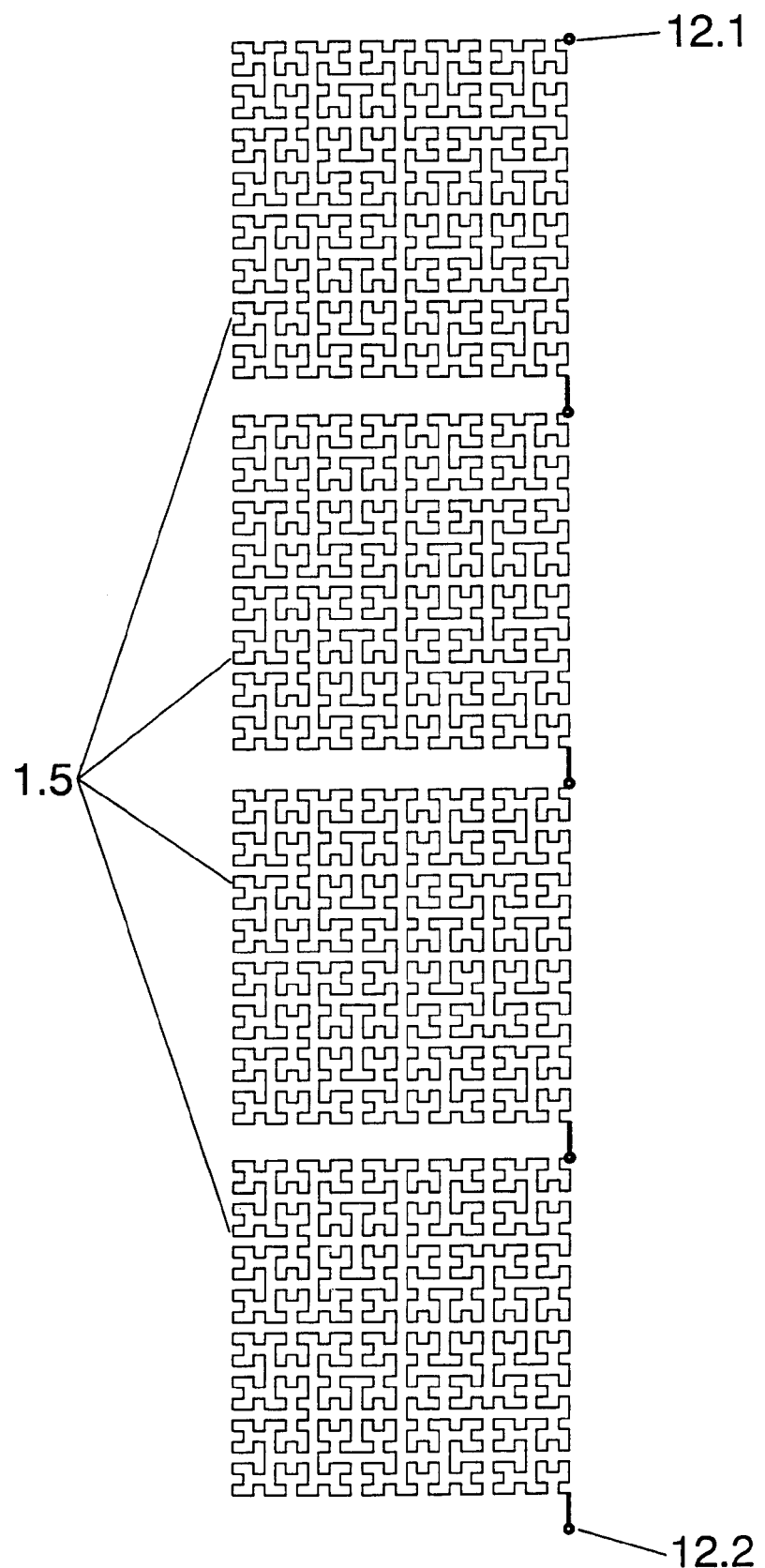
FIG. 12 shows another particular embodiment where a SFC transmission line is formed by a series connection of four Hilbert curves.

FIG. 12 shows another particular embodiment where a SFC transmission line is formed by a series connection of four Hilbert curves based on the particular case (1.5), wherein the curves shape the characteristic strip or slot of any of the well known transmission-line configurations described in the prior art (drawings (2.1), (2.2), (2.3), (2.4) and (2.5)) according to the spirit and scope of the present invention. Two tips form an input (12.1) and the output (12.2) of the SFC transmission line. As it becomes apparent to those skilled in the art another different number of connected curves can be used instead of four to conveniently increase or reduce the effective electrical length of the transmission line. The embodiment in FIG. 12 can be terminated in the same way as described in FIG. 11.

Figure 13:
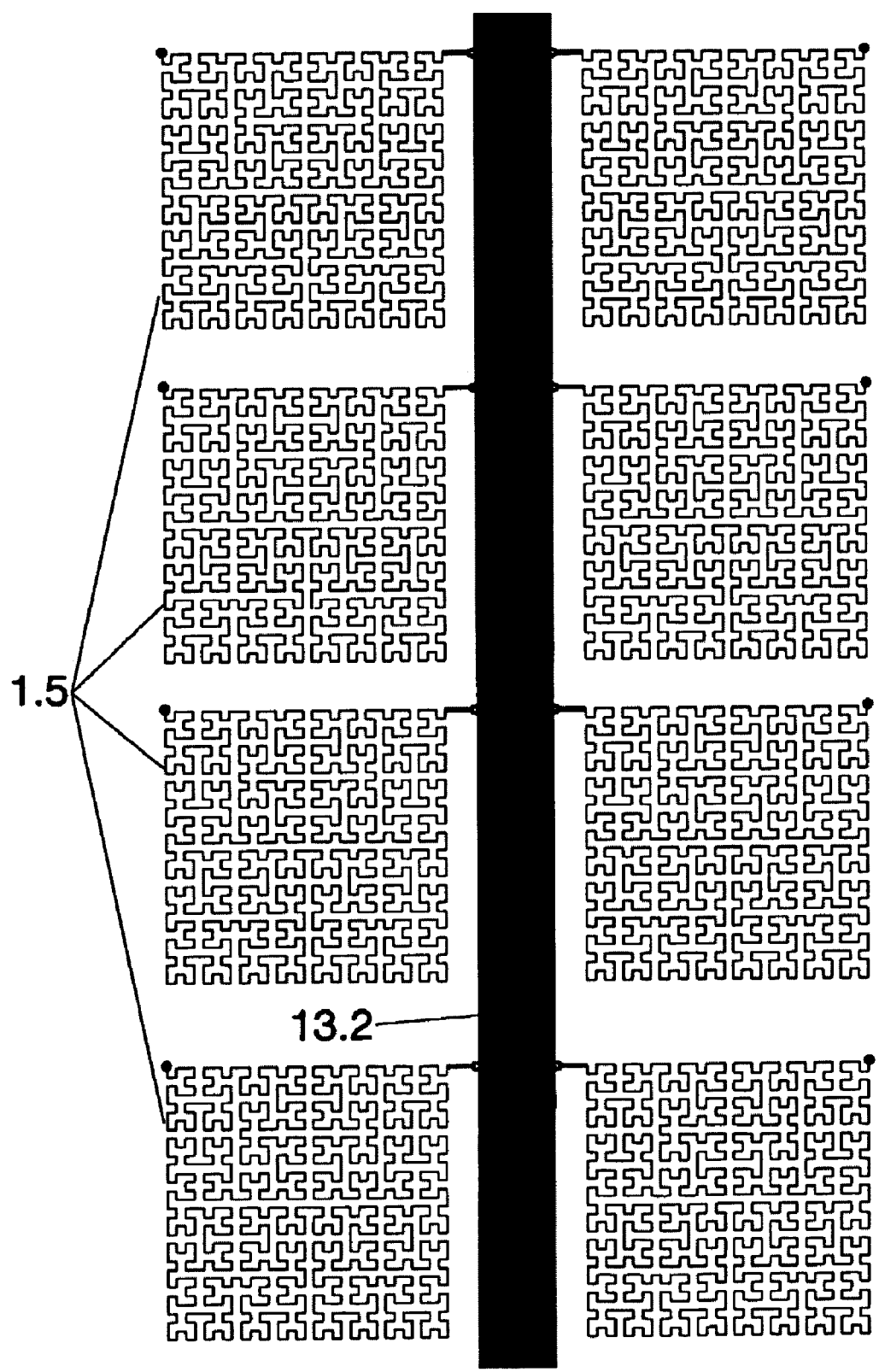
FIG. 13 shows the use of a SFC to load a conventional transmission line.

FIG. 13 shows the use of a SFC (1.5) to load a conventional transmission line (13.2). Any of the embodiments shown in FIG. 11 can be used to load the line, and of course any other SFC curve as for instance those described in FIGS. 1 through 9. The drawing in FIG. 13 shows the characteristic strip or slot that is applied in the present invention to any of the well known transmission-line configurations as described in the prior art (drawings (2.1), (2.2), (2.3), (2.4) and (2.5)). The resulting device can be used for instance as a slow-wave line, resonator, or as a filter.

Figure 14:
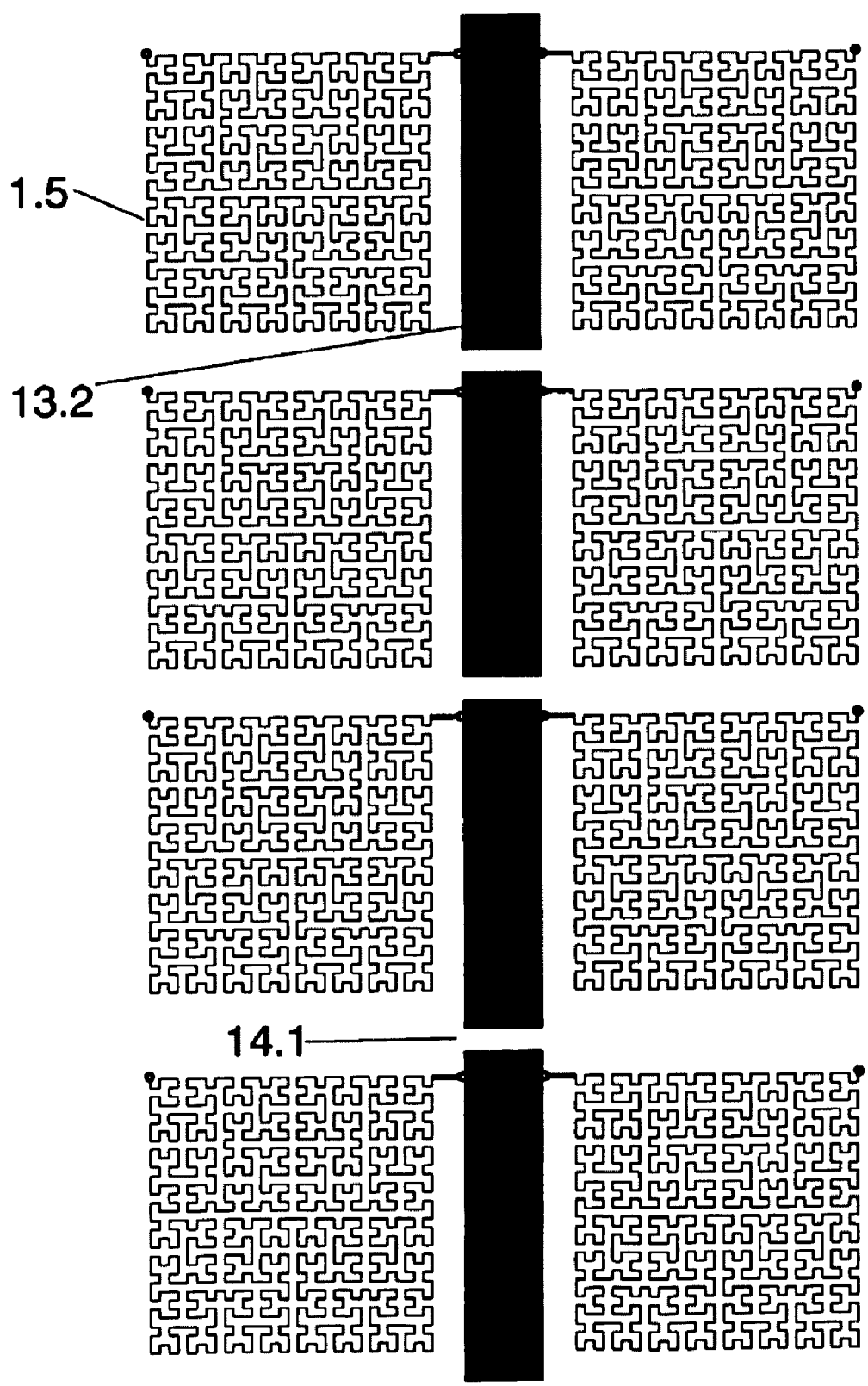
FIG. 14 shows a modification of the embodiment in FIG. 13 by including some capacitive gaps within the conventional transmission line.

FIG. 14 shows a modification of the embodiment in FIG. 13, in which the transmission line (13.2) loaded with SFC transmission lines based on the Hilbert curve (1.5) further includes some capacitive gaps (14.1) within the transmission line (13.2).

Figure 15:
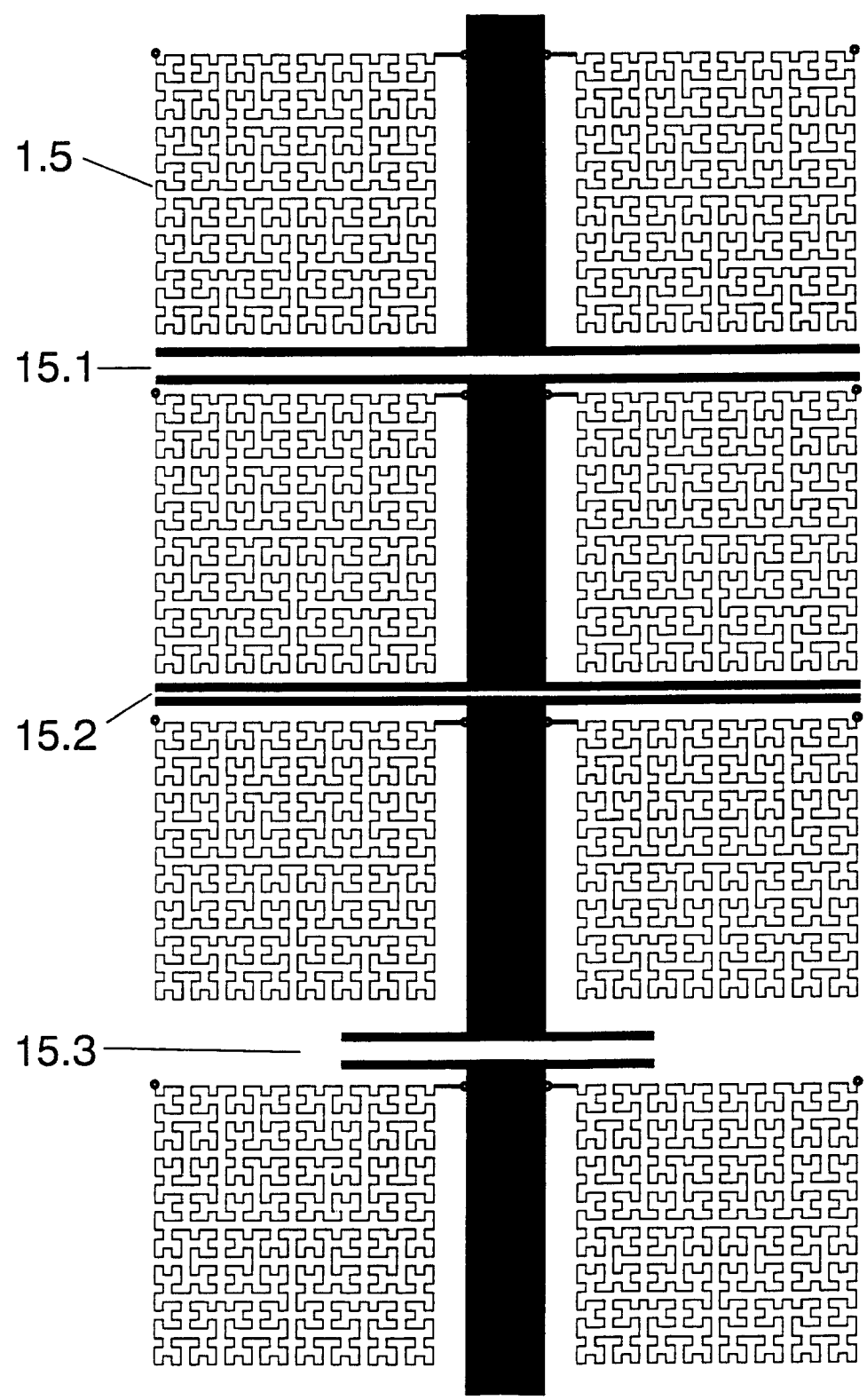
FIG. 15 shows a modification of the embodiment in FIG. 14 where the capacitance of the gaps is increased by means of additional conducting strips.

FIG. 15 shows a modification of the embodiment in FIG. 14, in which a transmission line loaded with SFC transmission lines based on the Hilbert curve (1.5) and including capacitive gaps, further increases the capacitance of the gaps by means of additional conducting strips ((15.1), (15.2), (15.3)).

Figure 16:
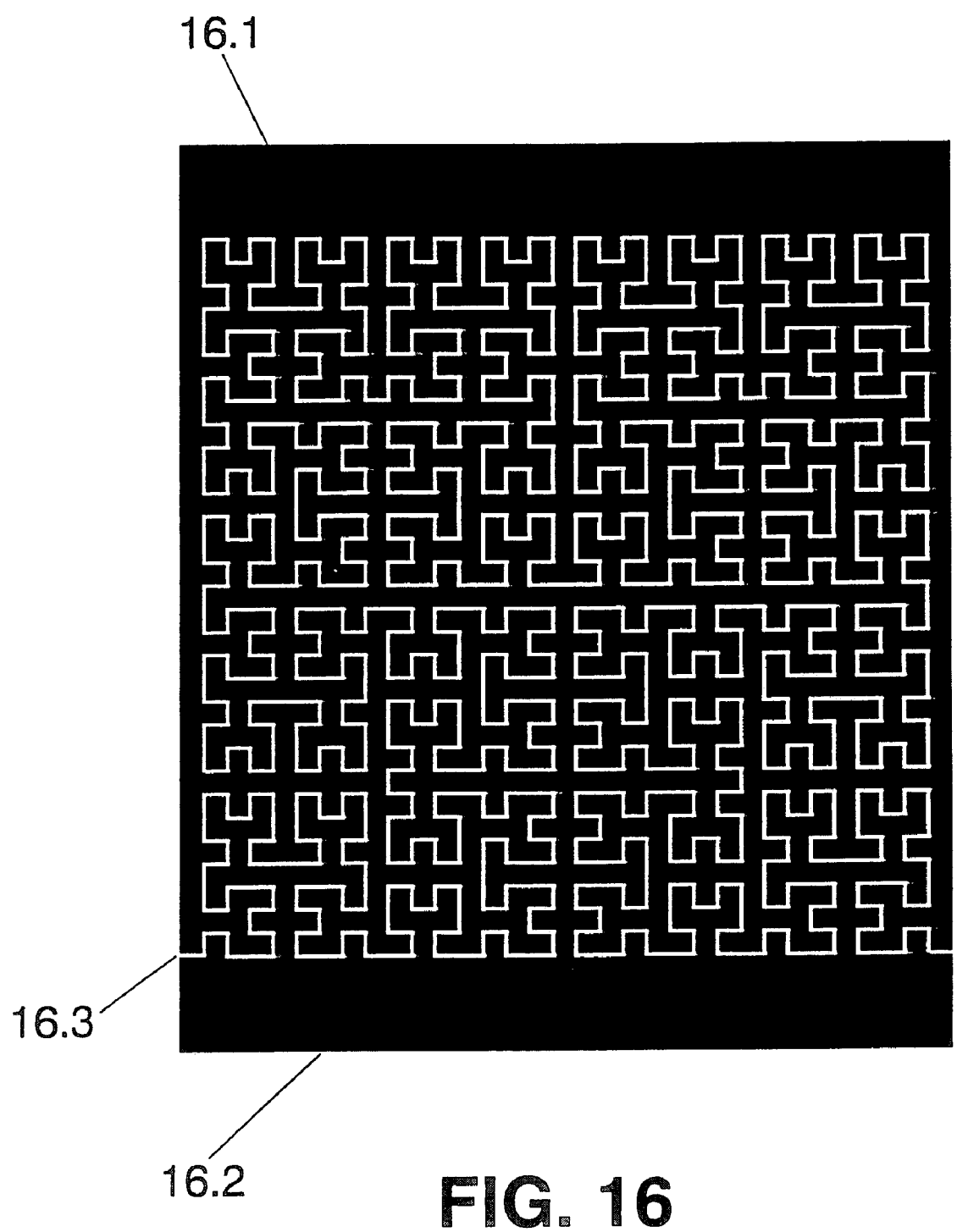
FIG. 16 describes the physical construction of a planar capacitor.

FIG. 16 describes the physical construction of a planar capacitor. The structure is formed by two metallic or superconducting plates (16.1) and (16.2) separated by a gap or slot (16.3), wherein the gap is shaped as a SFC. A particular case of a Hilbert curve (1.5) has been used here, but it is apparent to those skilled in the art that any other SFC (as for instance those described in FIGS. 1 through 9) can be used within the spirit and scope of the present invention.

FIG. 16 presents an embodiment of planar SFC capacitance which can be used instead of inter-digitated capacitances in planar circuits. The SFC capacitance is for instance composed by two co-planar metallic or superconducting strips, wherein the strips are separated by means of a slot, the slot being shaped as a SFC curve. Those skilled in the art will understand that the capacitance of this novel device can be controlled for instance by either adjusting the width or the length of the SFC slot (for example by adding more segments or by scaling the whole or part of the curve).

Prior art inter-digitated capacitances are widely used in planar circuits to provide high values of capacitive coupling between two metallic or superconducting patches or strips. These structures usually have a meander-shaped slot separating the two patches or strips. Often the strips or patches are mounted over a dielectric substrate; those skilled in the art will notice that the same conventional fabrication techniques can also be applied to the designs including the SFC slots disclosed in the present invention. One of the advantages of using the new SFC configuration described herein is that an even greater capacitance can be achieved by using a SFC-shaped slot. The capacitances find many uses in planar circuits forming part of resonators, DC blocks, and other reactive elements. In the spirit of the invention, this increase in capacitance could also be achieved by using any other SFC, FSFC, fractal, Hilbert, SZ, ZZ, HilbertZZ, Peano, Minkowski or Sierpinski curve.

Figure 17:
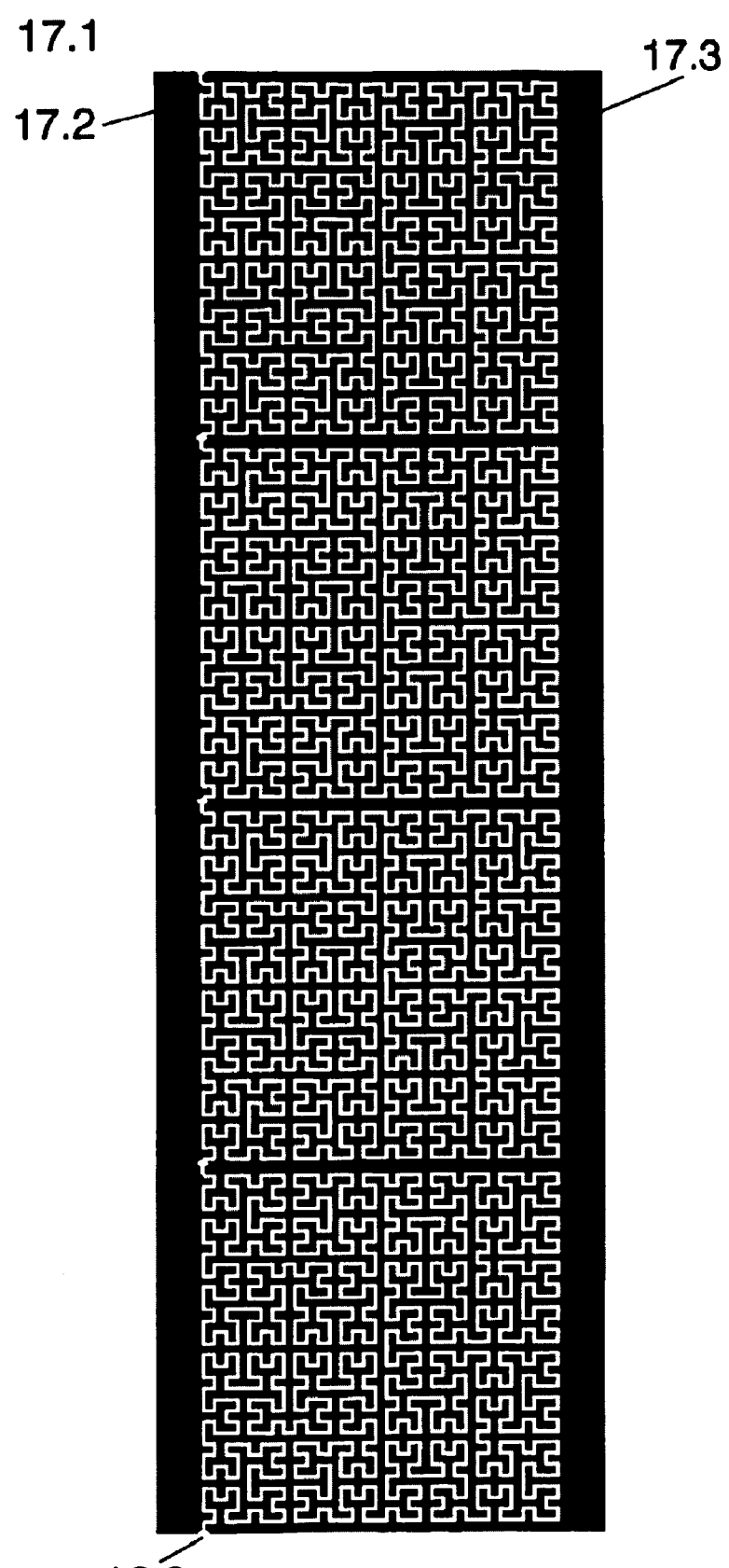
FIG. 17 shows an example of how the capacitance of the planar capacitor in FIG. 16 can be increased.

FIG. 17 shows an example of how the capacitance of the planar capacitor in FIG. 16 can be increased. The planar capacitor (17.1) comprises two metallic or superconducting plates (17.2) and (17.3) separated by a gap or slot (16.3). The length of the gap (16.3) is increased with respect to the planar capacitor of FIG. 16 by connecting several SFC curves.

FIG. 18 (prior art) shows a two-port resonator in which the resonant element is a straight, half-wave microstrip transmission line (18.3), and the input and output ports are coupled with capacitive gaps (18.1) and (18.2) at the edges of the resonant line.

Figure 19:
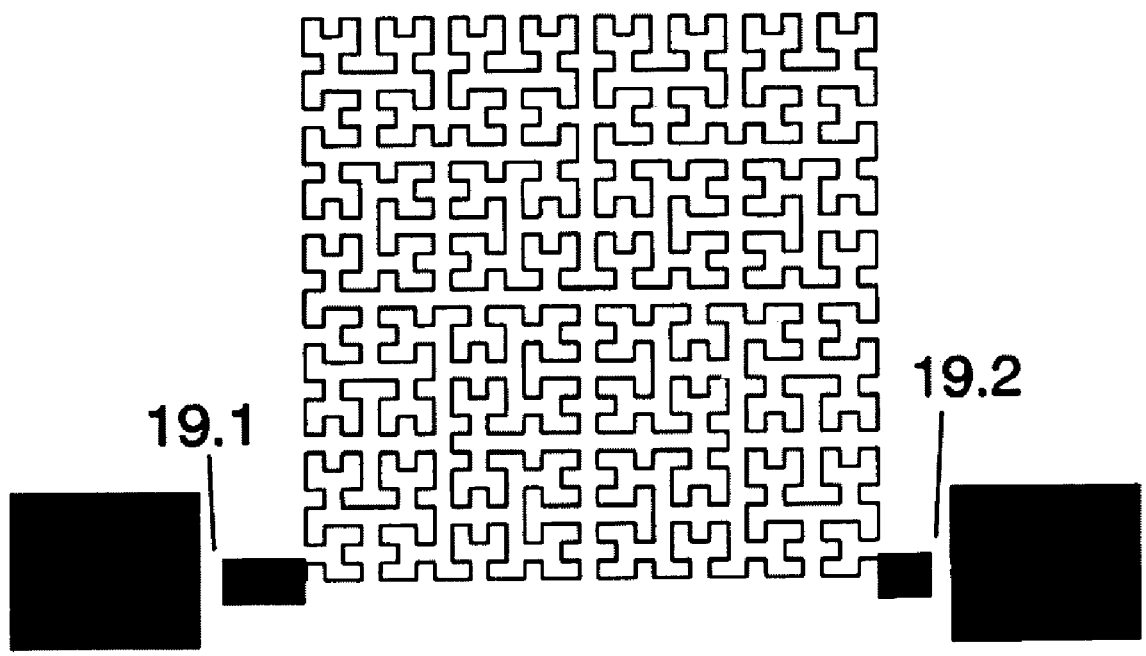
FIG. 19 shows a two-port resonator similar to the one in FIG. 1, but where the microstrip line is folded following a SFC pattern.

FIG. 19 shows a two-port resonator similar to the one in FIG. 18, but in which the microstrip line is folded following a SFC pattern (1.5). As pointed out in FIG. 10, this efficiently packs the length of the resonant line in a small surface of the planar substrate. The input and output ports are coupled with capacitive gaps (19.1, 19.2) at the edges of the resonant line.

FIG. 19 shows an example of a microstrip line resonator where the line has been folded following the Hilbert curve of FIG. 1. It is clear that other SFC, FSFC, fractal, Koch, SZ, ZZ, HilbertZZ, Peano, Minkowski or Sierpinski curves could be used instead (see examples in FIGS. 1, 3, 4, 5,6,7,8 and 9), according to the spirit of the present invention. The folded geometry efficiently packs the length of the resonant line.

Those skilled in the art will notice that the geometry can be used to shape the strip of a micro-strip, strip-line, co-planar or parallel plate transmission line. The strip can be constructed for instance with a metallic or superconducting material which can be deposited using well-known fabrication techniques over the surface of a dielectric substrate. Depending on the chosen configuration (strip-line, microstrip, parallel-plate, . . . ) the transmission line will obviously include other metallic or superconducting strips or ground-planes according to the description in FIG. 2. Also, the input (19.1) and output (19.2) gaps are used to control the coupling of the source and load to the resonator in the same way as used in previous art well-known configurations of resonators.

In another preferred embodiment, the resonator is directly connected to the input and output transmission lines. One of the main advantages of the described inventions is the substantial saving in substrate space. The saving is advantageous in many applications where volume and weight of the electronic equipment is critical, or when the substrate is expensive.

In a third preferred embodiment, the resonator is made on a MMIC substrate using the conventional foundry techniques of MMIC fabrication. In that case, the resonator can be included in a multi-layer structure and can be connected or electromagnetically coupled with circuitry not contained in the layer of the resonator.

Those skilled in the art will recognize the possibility of making filters using several structures like the SFC-folded line described above by providing electromagnetic coupling among the structures. This electromagnetic coupling can be realized with capacitive-slot gaps, inductive coupling, or other techniques. Furthermore, the SFC-folded lines in the filters do not necessarily need to be at resonance at any of the frequencies falling within the passband of the filter.

FIG. 20 (prior art) is a microstrip filter comprising several edge-coupled, half-wave (λ/2) straight microstrip line resonators.

Figure 21:
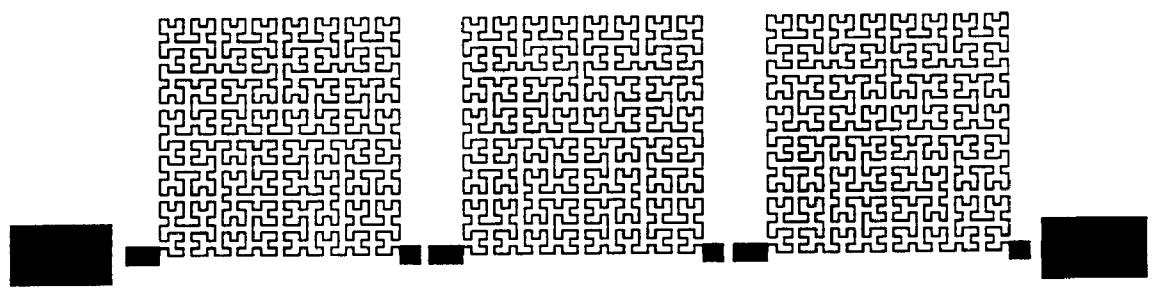
FIG. 21 is a filter made by capacitively coupling the edges of several resonators like the ones shown in FIG. 19.

FIG. 21 is a filter made by capacitively coupling the edges of several resonators like the ones shown in FIG. 19.

Figure 22:
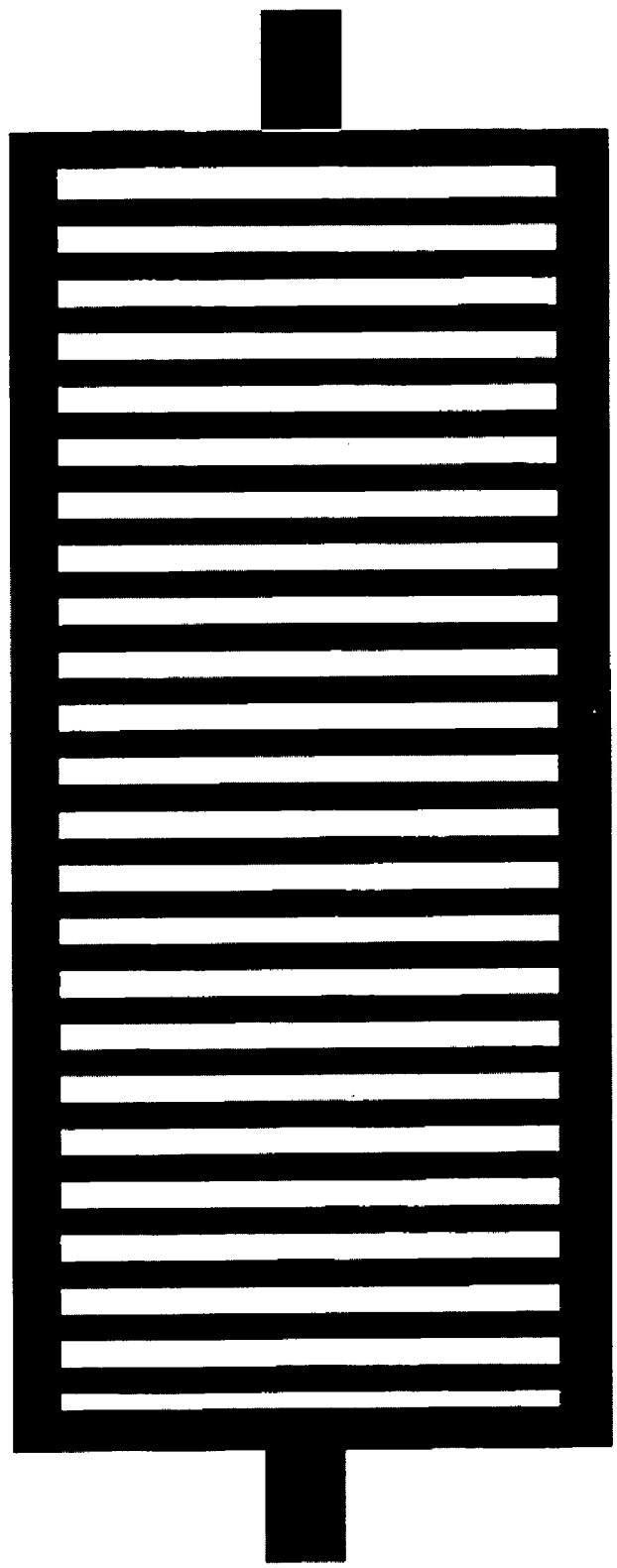
FIG. 22 is a detail of a conventional ladder slow-wave line.

FIG. 22 (prior art) is a detail of a ladder slow-wave line. Instead of using a solid strip, this line uses a fine ladder pattern, whose features are much smaller than the free-space wavelength. This reduces the velocity of propagation in the transmission line.

Figure 23:
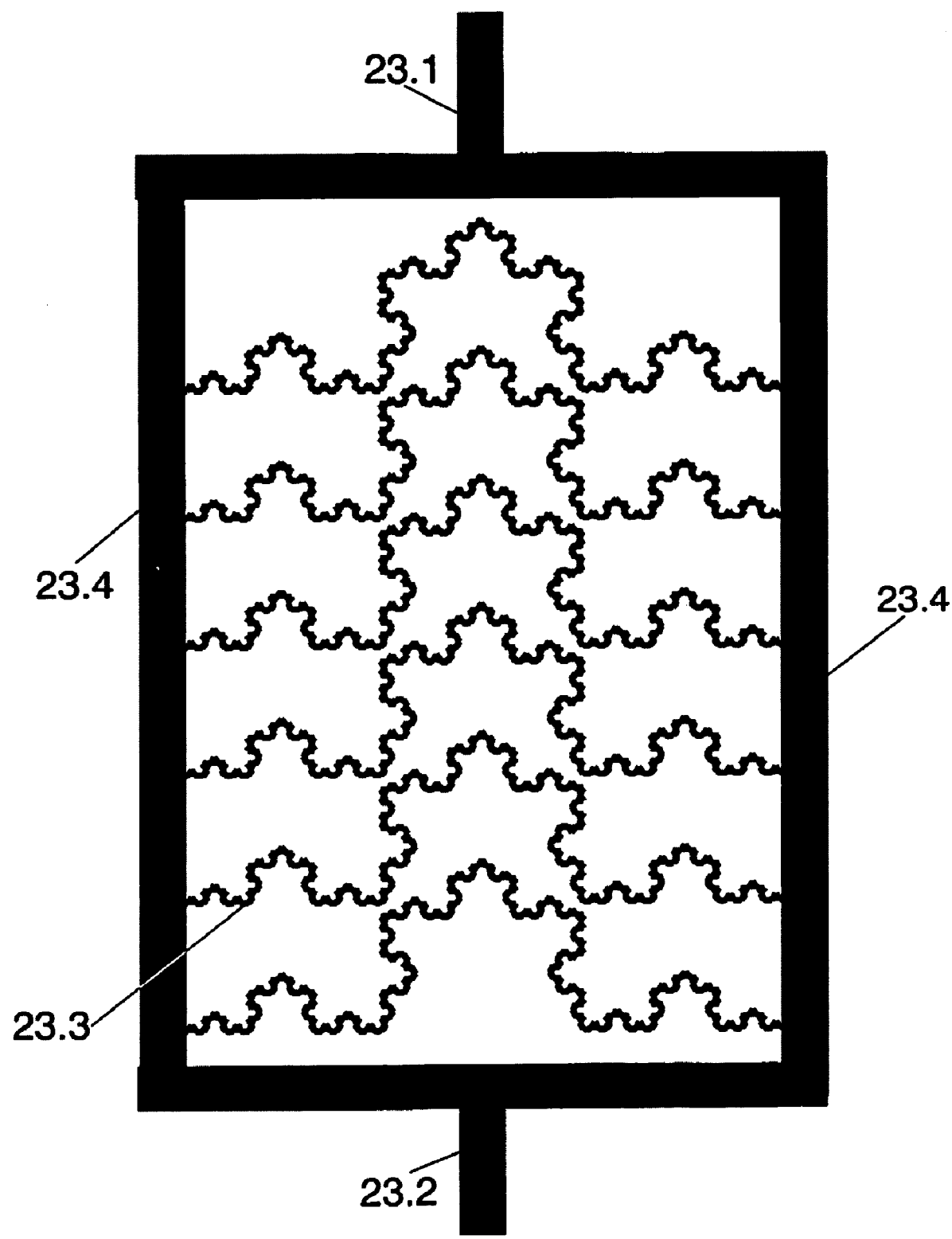
FIG. 23 is a detail of a ladder slow-wave line like the one in FIG. 22, but substituting the straight, step-like strips in between the two parallel, handle-like strips, by strips following a SFC curve based on the Koch fractal curve.

FIG. 23 is a detail of a ladder slow-wave line like the one in FIG. 22, but substituting the straight, step-like strips in between the two parallel, handle-like strips, by strips following a SFC curve based on the Koch fractal curve. The ladder slow-wave line has an input (23.1) and an output (23.2).

The Koch SFC-shaped strips (23.3) connecting the two long and parallel narrow strips (23.4) provide an enhancement in the capacitance per unit length of the structure with respect to what is achieved in a prior art structure using straight strips instead of the SFC-shaped ones presented herein. The high increase in capacitance per unit length is made with little change in the inductance per unit length of the structure, which is dominated by the effect of the two narrow, parallel strips. This increased capacitance provides a reduced velocity of propagation of the electromagnetic signals along the structure. In the spirit of the invention, this increase in capacitance could also be achieved by using any other SFC, FSFC, fractal, Hilbert, SZ, ZZ, HilbertZZ, Peano, Minkowski or Sierpinski curve that would not significantly alter the overall width of the structure nor the width of its two narrow, parallel strips.

This type of line would not only be of use in a filter with straight transmission line resonators (like the one in FIG. 20), the resonators in FIGS. 19 and 21 could also be made out of slow-wave lines with SFC, FSFC, fractal, Hilbert, SZ, ZZ, HilbertZZ, Peano, Minkowski or Sierpinski features, further reducing their size for a fixed resonant frequency.

Figure 24:
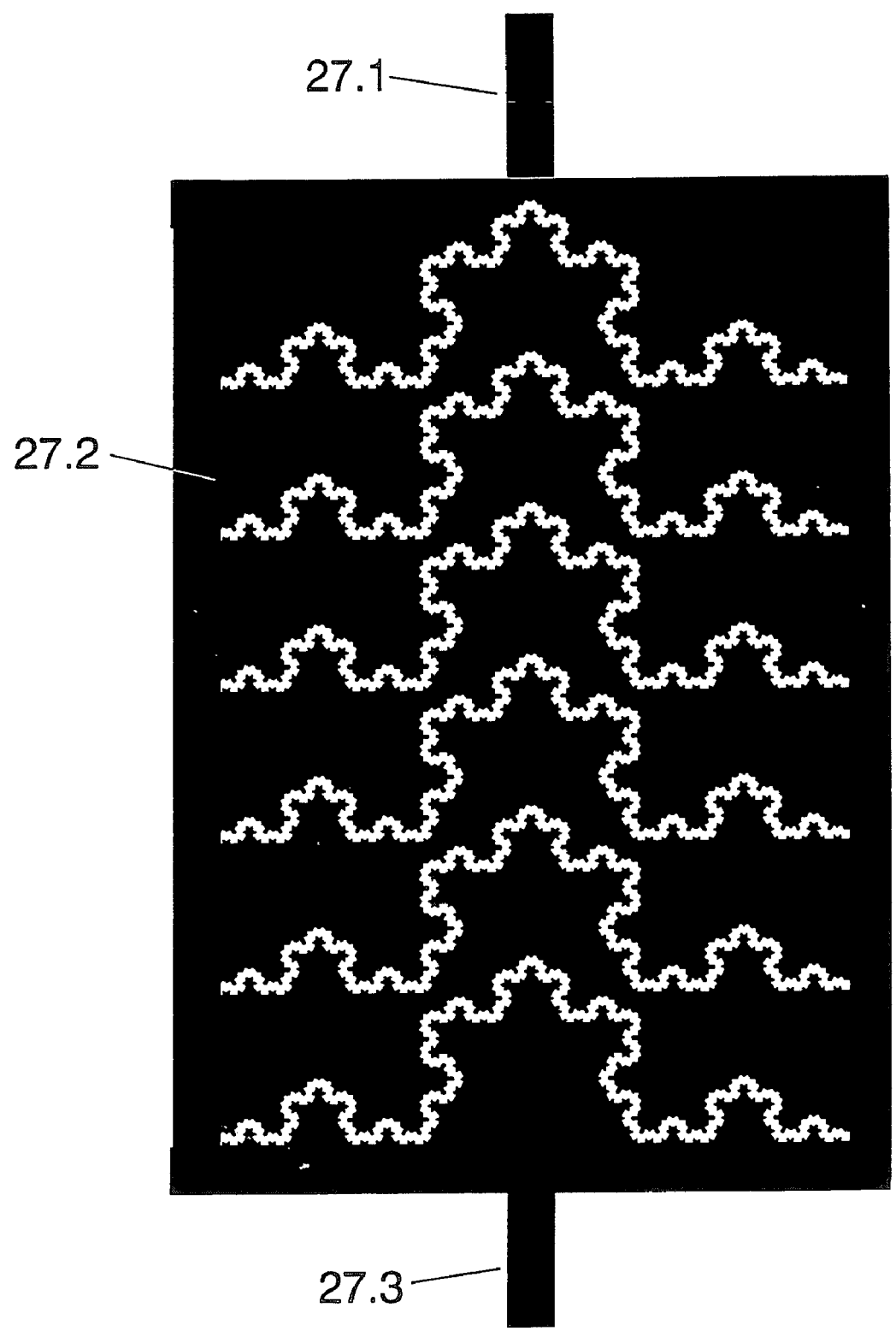
FIG. 24 shows another example of slow-wave transmission line where the metal strip is impressed with several slots based on SFC curves.

FIG. 24 shows another example of a slow-wave transmission line where the metal strip (27.2) is impressed with several slots based on SFC curves. The slow-wave transmission line has an input (27.1) and an output (27.3).

Figure 25:
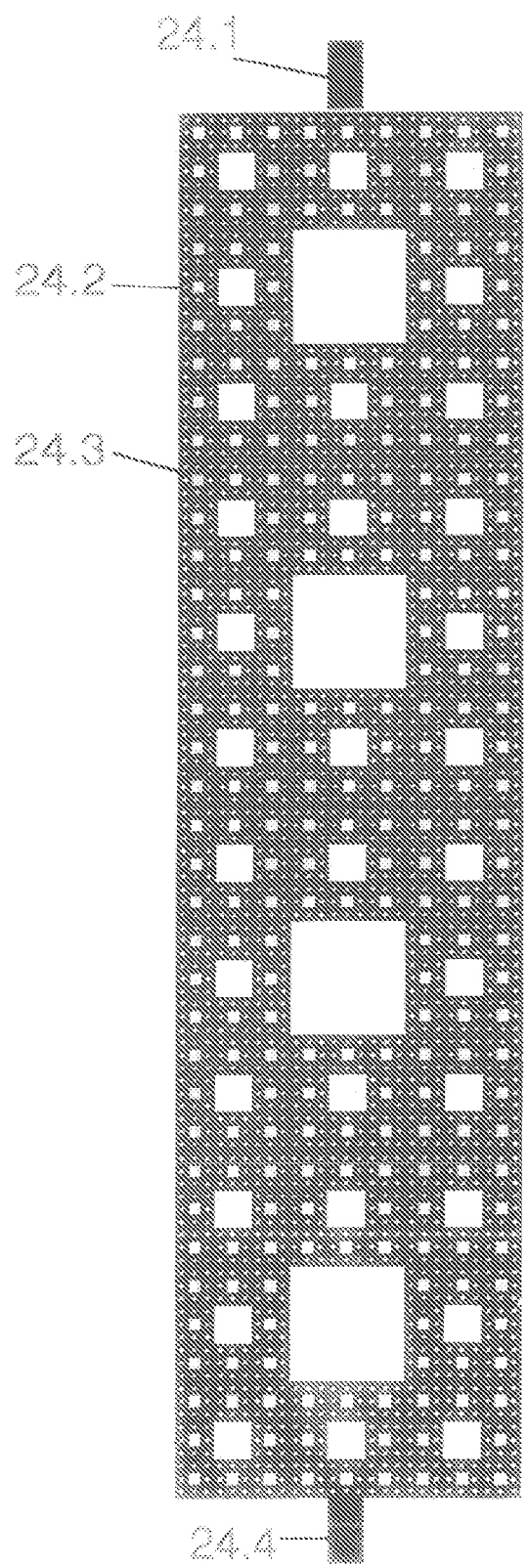
FIG. 25 shows another example of a slow-wave transmission line comprising a conducting strip, wherein such strip has been etched with a fractal-like motive generated after an IFS algorithm based on the fractal known as Sierpinski Carpet.

FIG. 25 shows another example of slow-wave transmission line comprising a conducting strip (24.2) (the metallic or superconducting part is shown in black), wherein such strip has been etched with a fractal-like motive (24.3) generated after an IFS algorithm based on the fractal known as Sierpinski Carpet. The slow-wave transmission line has an input (24.1) and an output (24.4). The self-inductance of the strip is increased this way while the capacitance is kept high compared to other classical mechanisms due to the space-filling properties (fractal dimension) of the fractal-like shape. The electrical length of the transmission line is increased such that the slow-wave transmission line can be packed in a reduced space.

Figure 26:
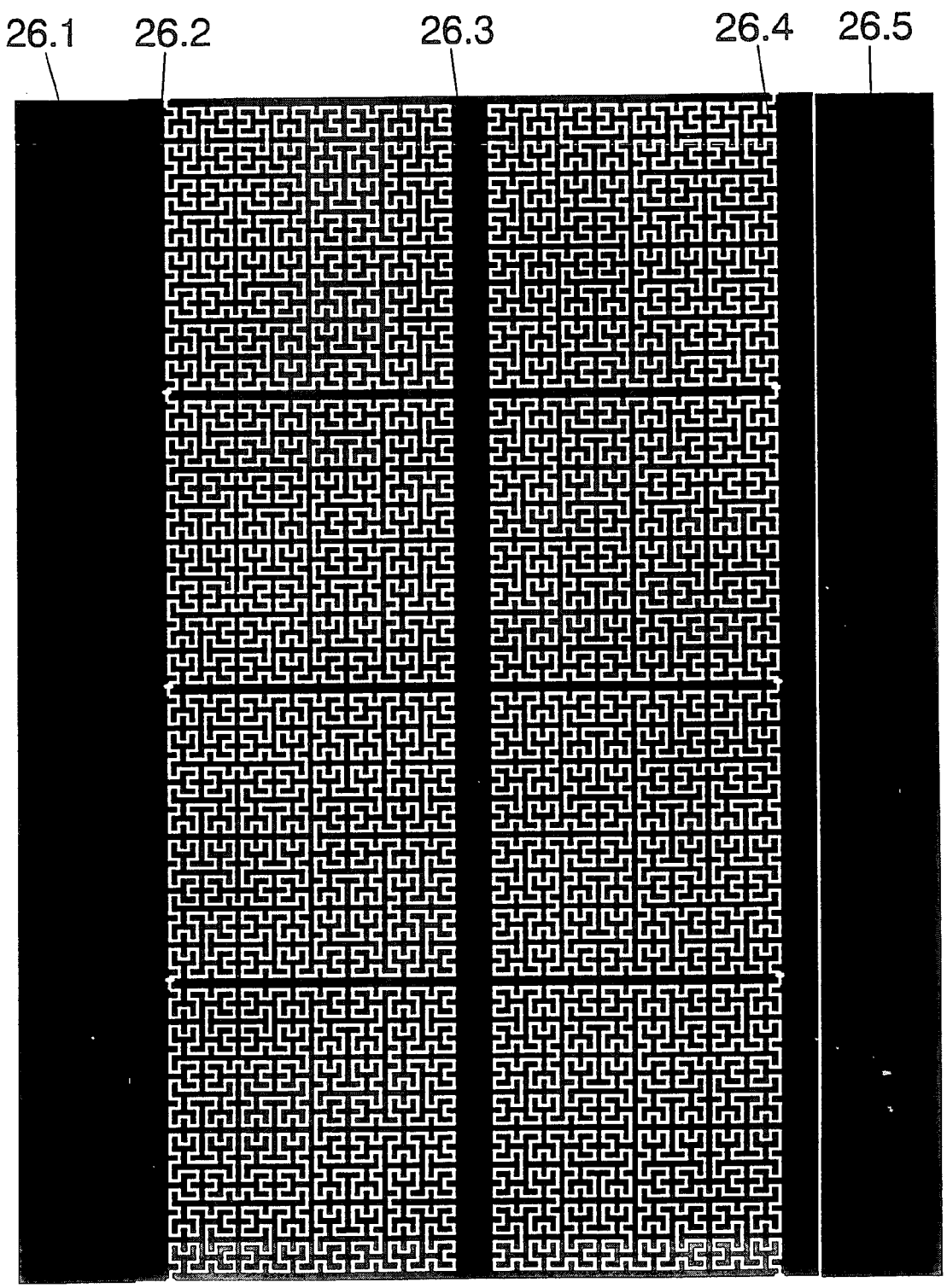
FIG. 26 shows another use of an SFC curve in a co-planar transmission-line.

FIG. 26 shows another use of a SFC in a co-planar transmission-line. The characteristic central strip (26.3) of a co-planar line is separated from the ground strips (26.1) and (26.5) by two capacitive gaps (26.2) and (26.4) at both sides of the transmission line, wherein the gaps are shaped as a SFC (in this particular example a Hilbert curve). A slow-wave transmission line is formed this way such that the length of the transmission line is reduced compared to conventional co-planar transmission lines.

Figure 27:
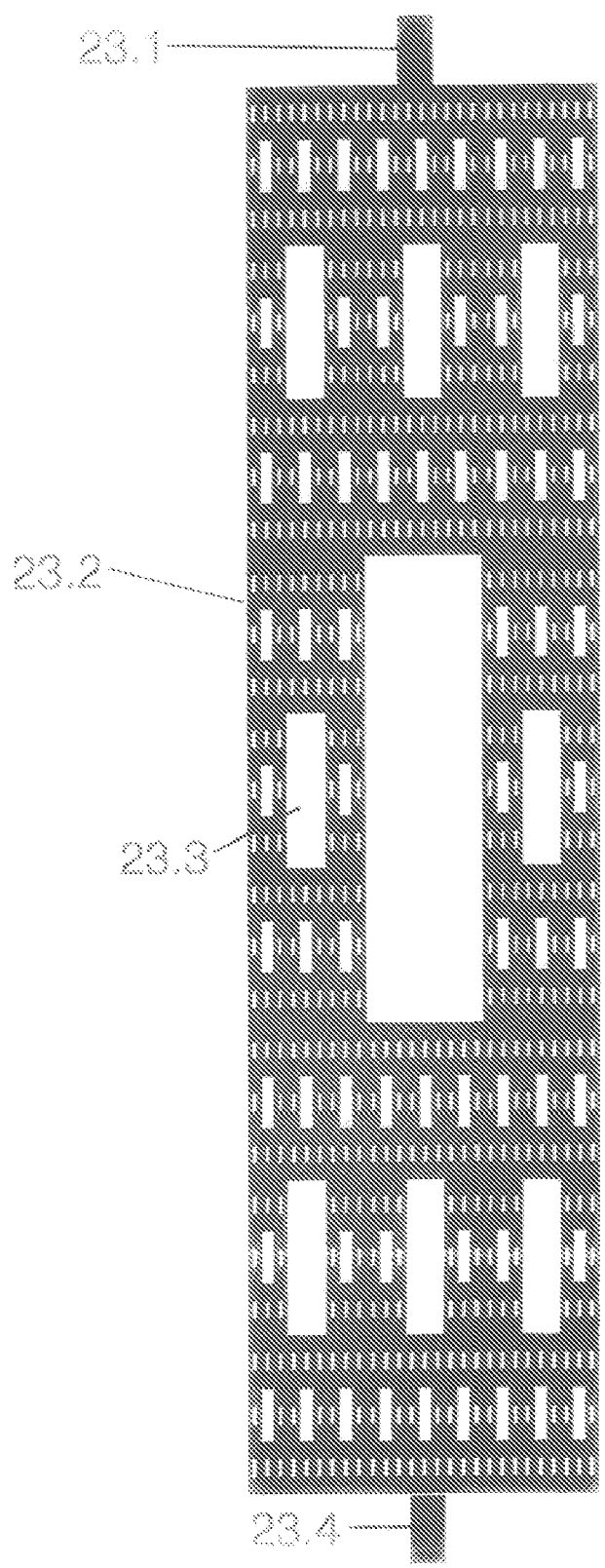
FIG. 27 shows a slow-wave guided structure comprising a conducting strip, wherein such strip has been etched with a fractal-like motive generated after an IFS algorithm based on the fractal known as Sierpinski Carpet.

FIG. 27 shows a slow-wave guided structure comprising a conducting strip (23.2) (the metallic or superconducting part is shown in black), wherein such strip has been etched with a fractal-like motive (23.3) generated after an IFS algorithm based on the fractal known as Sierpinski Carpet. The slow-wave guided structure has an input (23.1) and an output (23.4). The self-inductance of the strip is increased this way while the capacitance is kept high compared to other classical mechanisms due to the space-filling properties (fractal dimension) of the fractal-like shape. The electrical length of the transmission line is increased such that the slow-wave transmission line can be packed in a reduced space.

Figure 28:
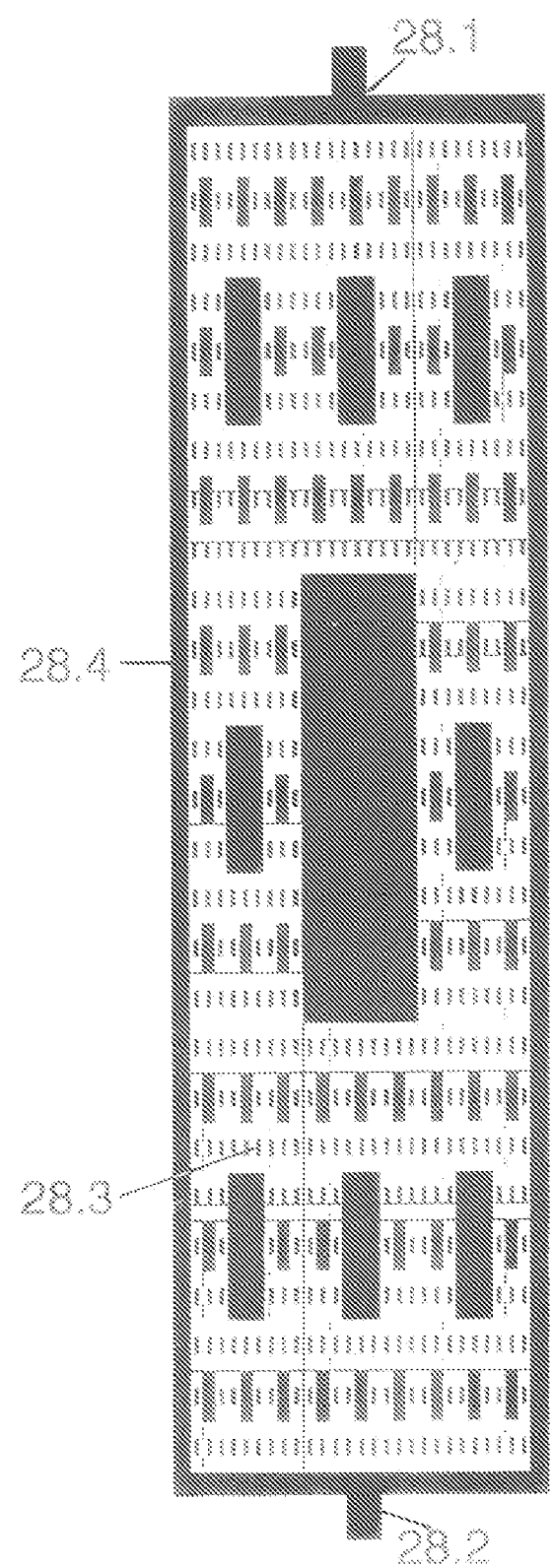
FIG. 28 shows another example of slow-wave guided structure where the central strip is impressed with a slot, wherein such slot is shaped as a fractal structure based on the Sierpinski Carpet.

FIG. 28 shows another example of a slow-wave guided structure where the central strip (28.4) is impressed with a slot (28.3), wherein such slot is shaped as a fractal structure based on the Sierpinski Carpet. The slow-wave guided structure includes an input (28.1) and an output (28.2).

Figure 29:
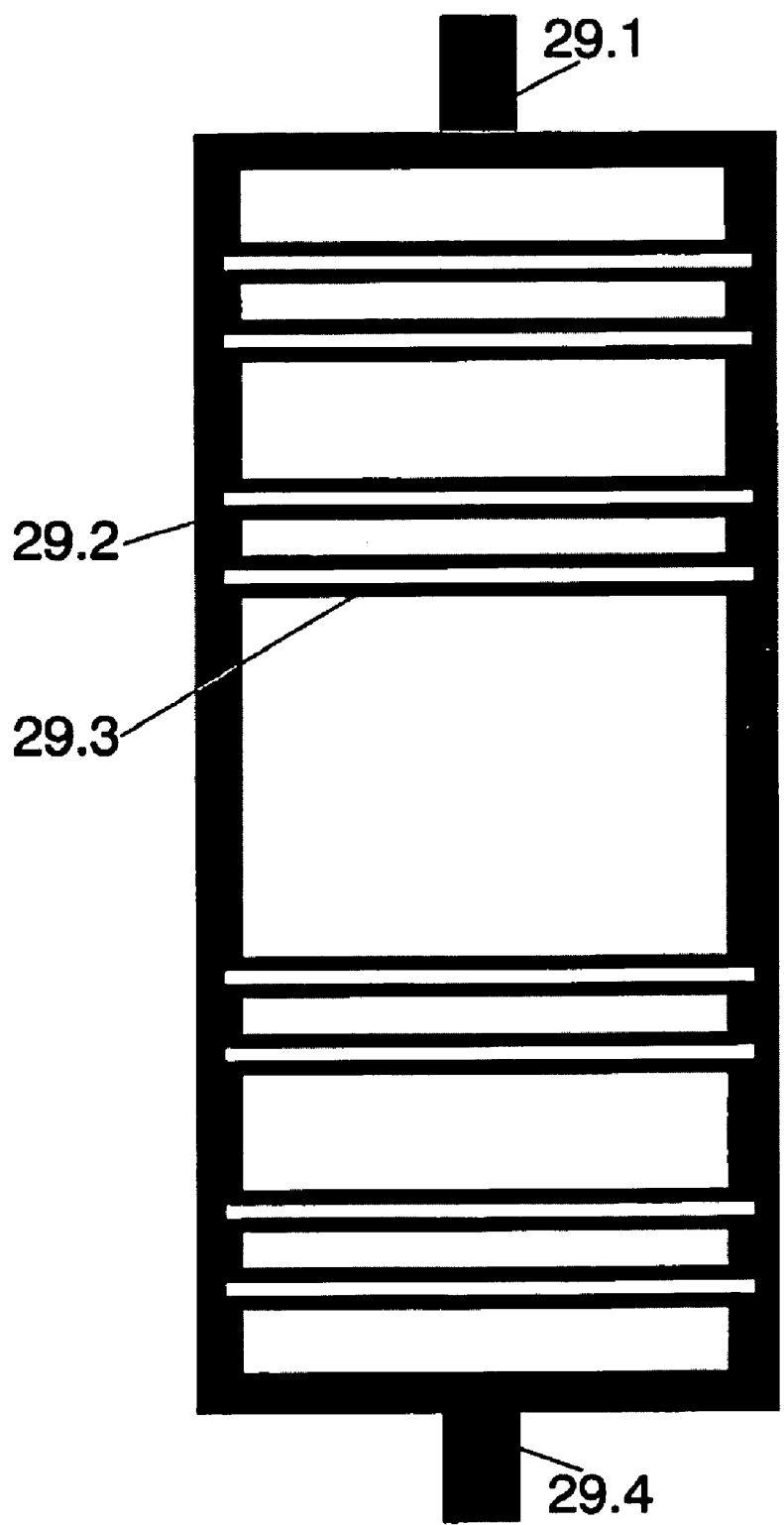
FIG. 29 shows another example of a slow-wave guided structure where the central part of the metallic strip is removed and several straight steps are impressed according to a fractal distribution of points with a fractal dimension smaller than one such as the Cantor Set, wherein the fractal distribution determines the spacing between the steps.

FIG. 29 shows another example of a slow-wave guided structure where the central part of the metallic strip (29.2) is removed and several straight steps (29.3) are impressed according to a fractal distribution of points with a fractal dimension smaller than one such as the Cantor Set, wherein the fractal distribution determines the spacing between the steps (29.3). The slow-wave guided structure includes an input (29.1) and an output (29.4).

Figure 30:
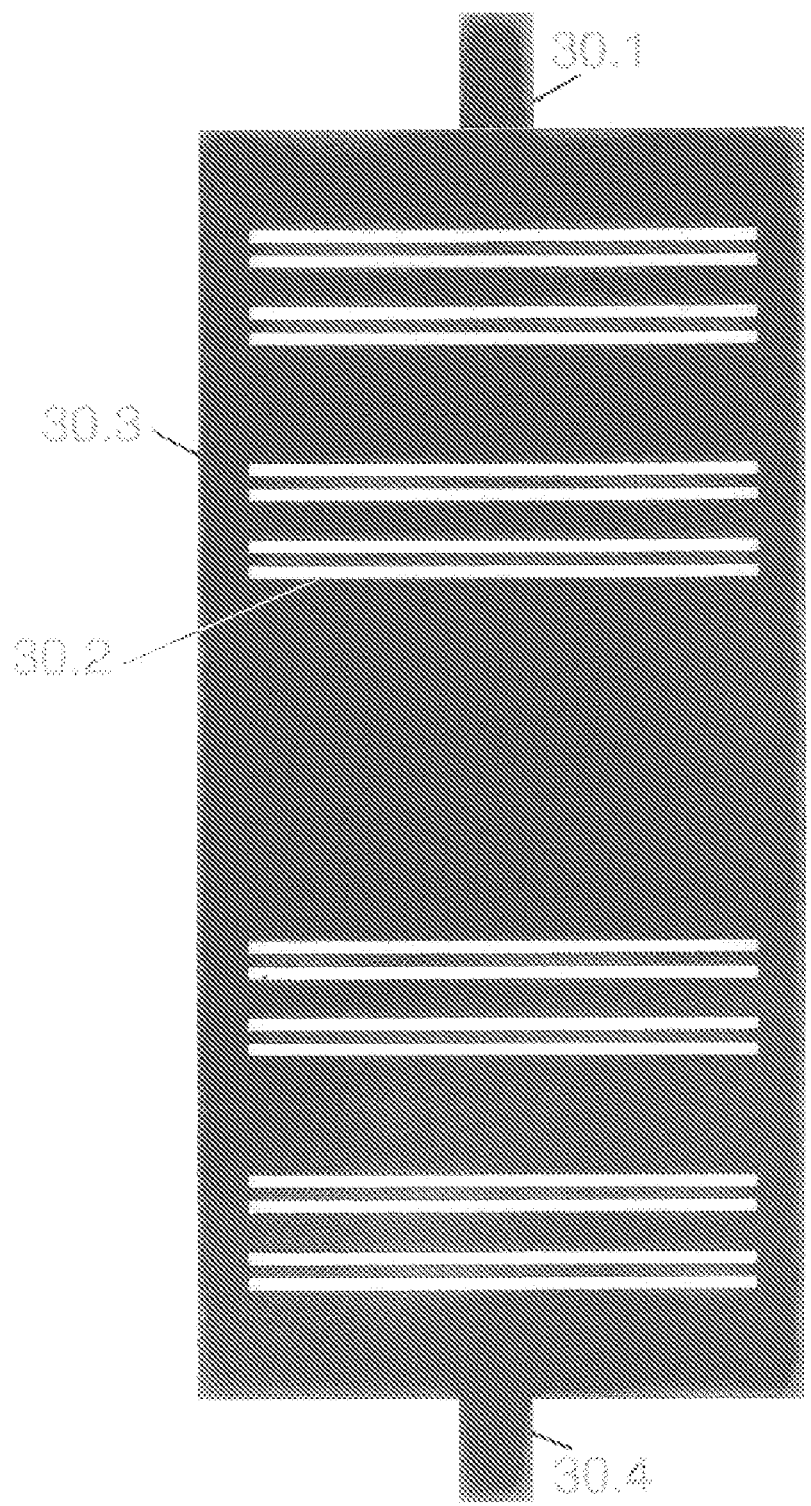
FIG. 30 shows the complementary version of the slow-wave structure in FIG. 29 where the fractal staircase based on the Cantor Set is slotted in the central strip of the slow-wave guided structure.

FIG. 30 shows the complementary version of the slow-wave structure in FIG. 29 where the fractal staircase based on the Cantor Set is slotted (30.2) in the central strip (30.3) of the slow-wave guided structure. The slow-wave structure of FIG. 30 includes an input (30.1) and an output (30.4).

The arrangement of the velocity-reducing features along the resonator does not necessarily have to be periodic. FIG. 27 shows a modified embodiment using a Sierpinski Carpet metallic or superconducting guiding structure. Note that the parallel, narrow strips along the edge of the resonator are maintained to obtain high inductance and low propagation velocity along the structure. Other non-periodic structures are shown in FIGS. 29 and 30, where a fractal-like distribution for the position of the strips, (29.3), (29.2), (30.2) and (30.3) has been chosen to further increase the capacitance per unit length and further decrease the propagation velocity.

FIG. 31 (prior art) shows a hairpin filter. It is an evolution of a parallel-coupled, straight-line filter in which the line resonators are folded. This is essentially a typical half-wave parallel-coupled-line filter in which the line resonators are folded in half. The folded line resonators of FIG. 31 occupy a region with a vertical dimension approximately equal to a quarter of the operating wavelength ($\lambda/4$).

Figure 32:
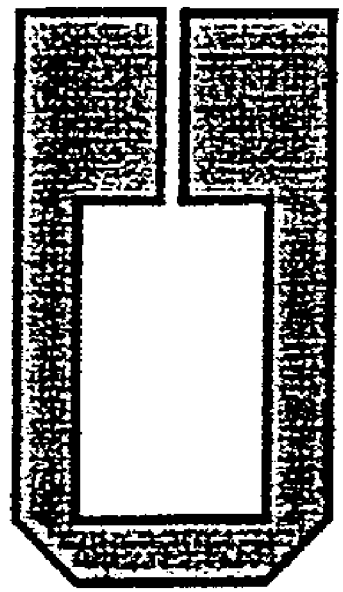
FIG. 32 shows two hairpin resonators using capacitive load at their edges to reduce the size of the microstrip line.
Figure 32:
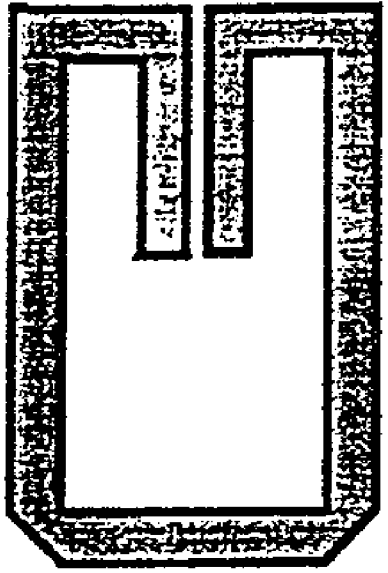

FIG. 32 shows two hairpin resonators using capacitive load at their edges to reduce the size of the microstrip line. Resonator (32.1) uses coupled-lines to realize such capacitance; Resonator (32.2) shows a resonator with a straight slot capacitance.

Figure 33:
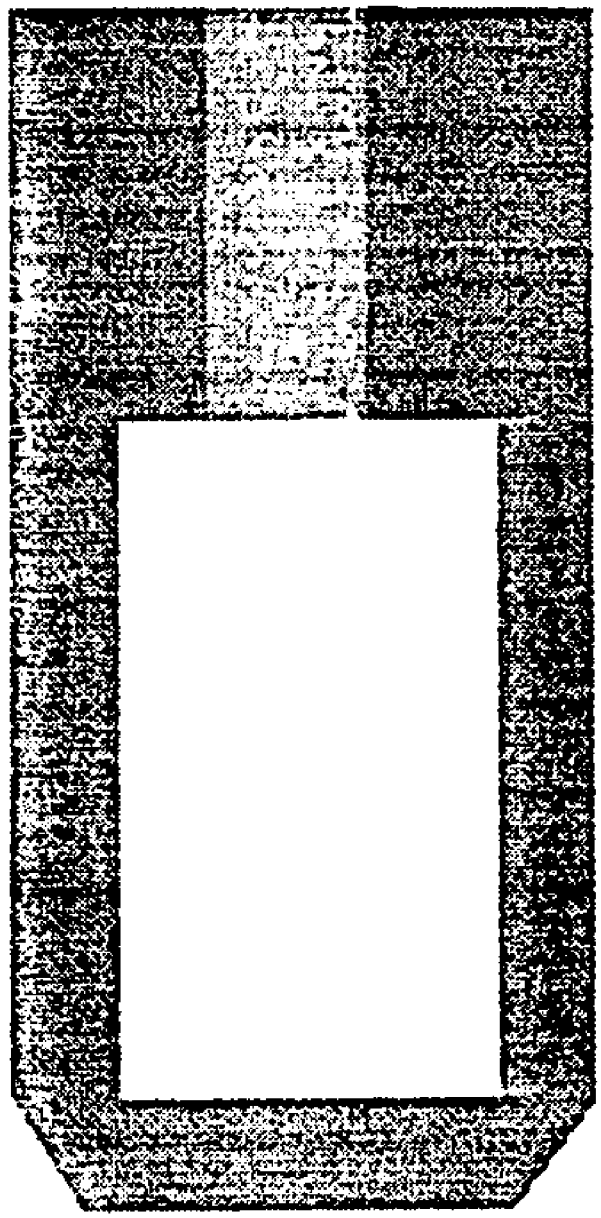
FIG. 33 shows a hairpin resonator with a capacitance made with a SFC-shaped slot to maximize the capacitive coupling.

FIG. 33 shows a hairpin resonator with a capacitance made with a SFC-shaped slot to maximize the capacitive coupling.

Figure 34:
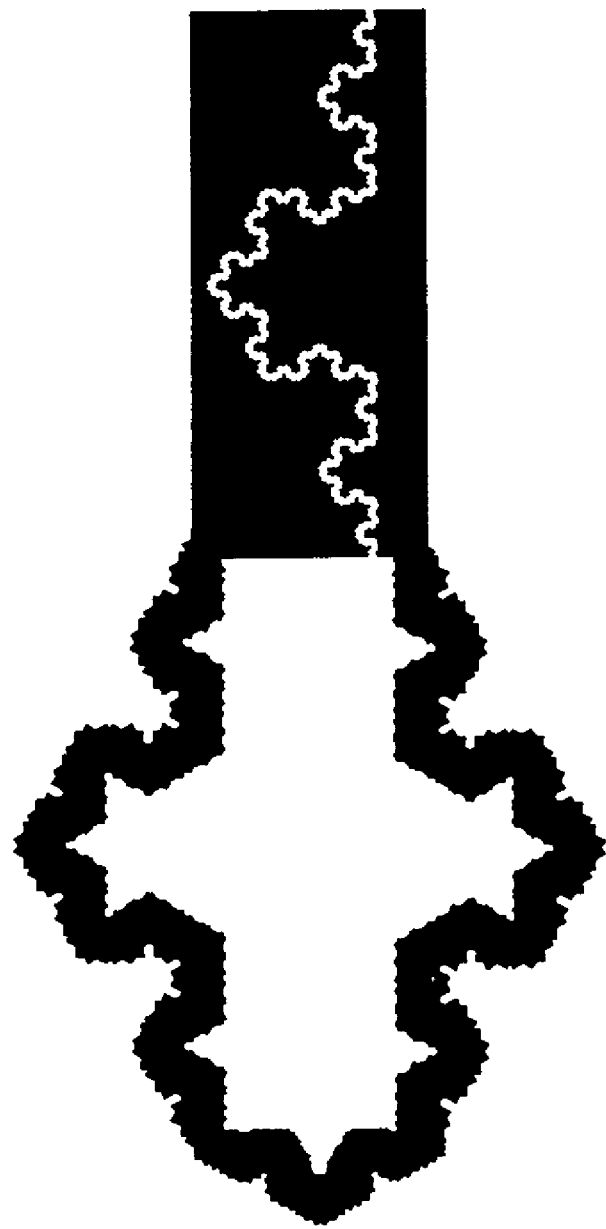
FIG. 34 shows an evolution of FIG. 33, where SFC geometries are not only used to shape the slot of the capacitance, but also to shape the microstrip line joining the electrodes of the capacitor.

FIG. 34 shows an evolution of FIG. 33, where SFC geometries are not only used to shape the slot of the capacitance, but also to shape the microstrip line joining the electrodes of the capacitor.

Figure 35:
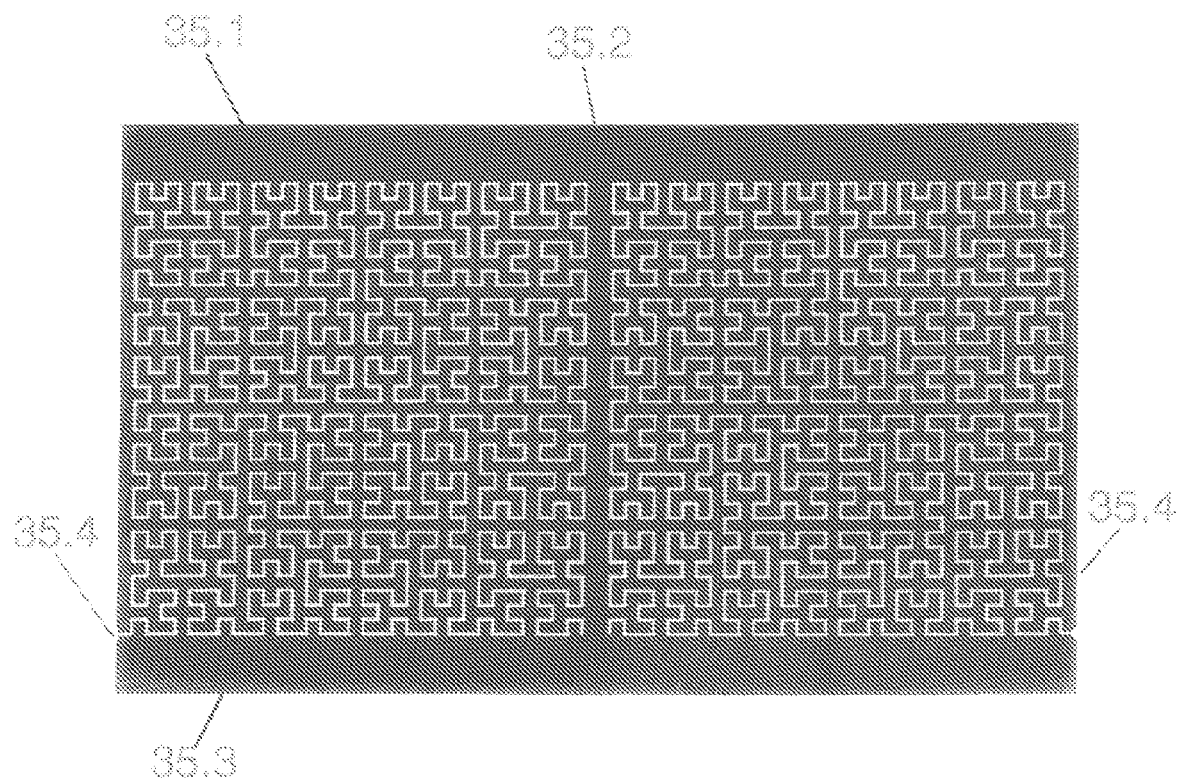
FIG. 35 describes a parallel first order resonator formed by a central inducting strip connected in parallel with two adjacent capacitive gaps. As it is clear to those skilled in the art, the resonator can be used as a filter or part of a filter.

FIG. 35 describes a parallel first order resonator formed by a central inducting strip (35.2) connected in parallel with two adjacent capacitive gaps (35.4). The parallel first order resonator further includes two plates (35.1) and (35.3) separated by the two adjacent capacitive gaps (35.4). As it is clear to those skilled in the art, the resonator can be used as a filter or part of a filter.

Figure 36:
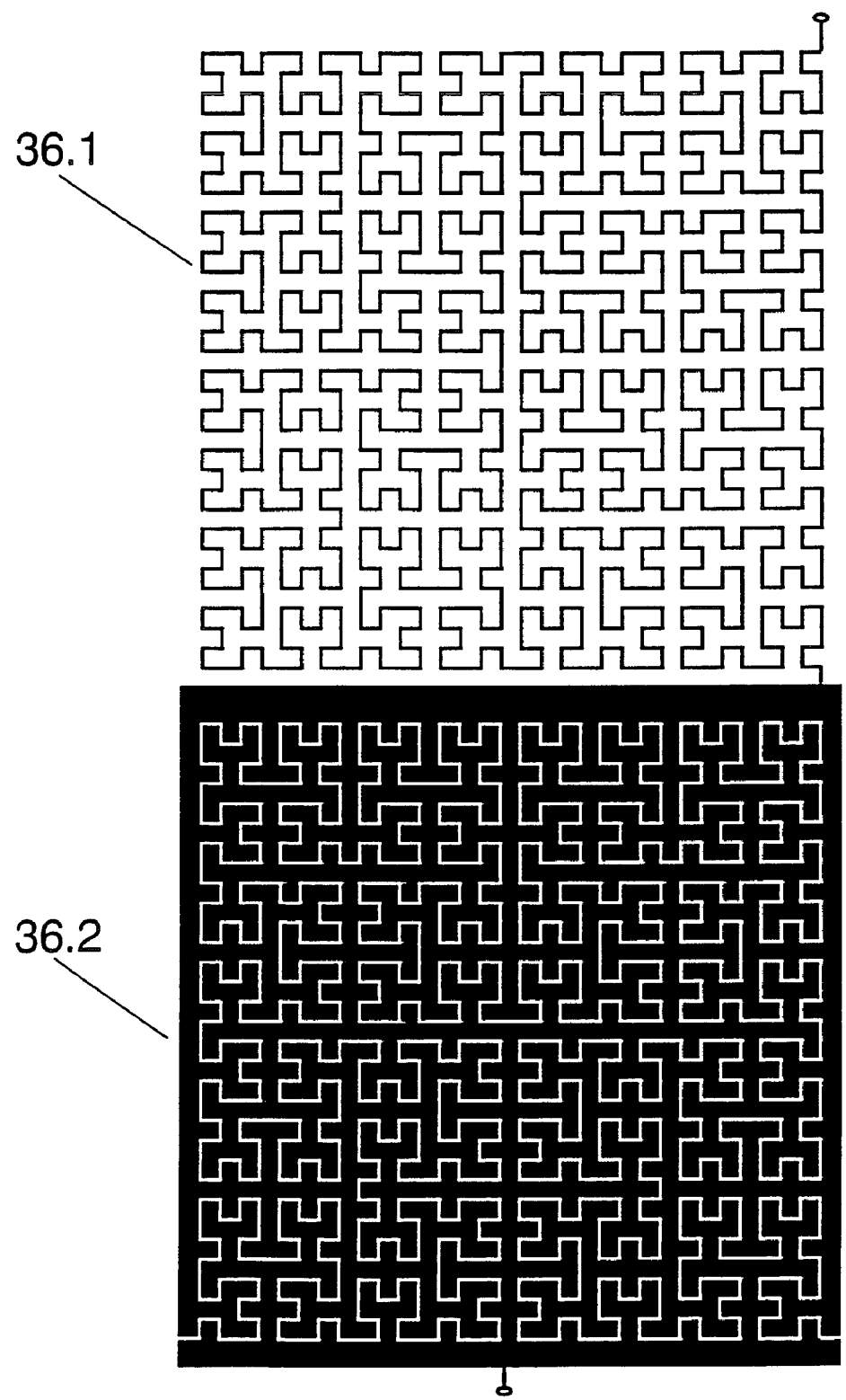
FIG. 36 describes a series first order resonator formed by a planar capacitor with a series connection to a planar inductor, wherein the capacitor is constructed for instance as described in FIG. 16 and wherein the inductor is a conducting strip shaped as a SFC curve. As it is clear to those skilled in the art, the resonator can be used as a filter or part of a filter.

FIG. 36 describes a series first order resonator formed by a planar capacitor (36.2) with a series connection to a planar inductor (36.1), wherein the capacitor is constructed for instance as described in FIG. 16 and wherein the inductor is a conducting strip shaped as a SFC curve. As it is clear to those skilled in the art, the resonator can be used as a filter or part of a filter.

Figure 37:
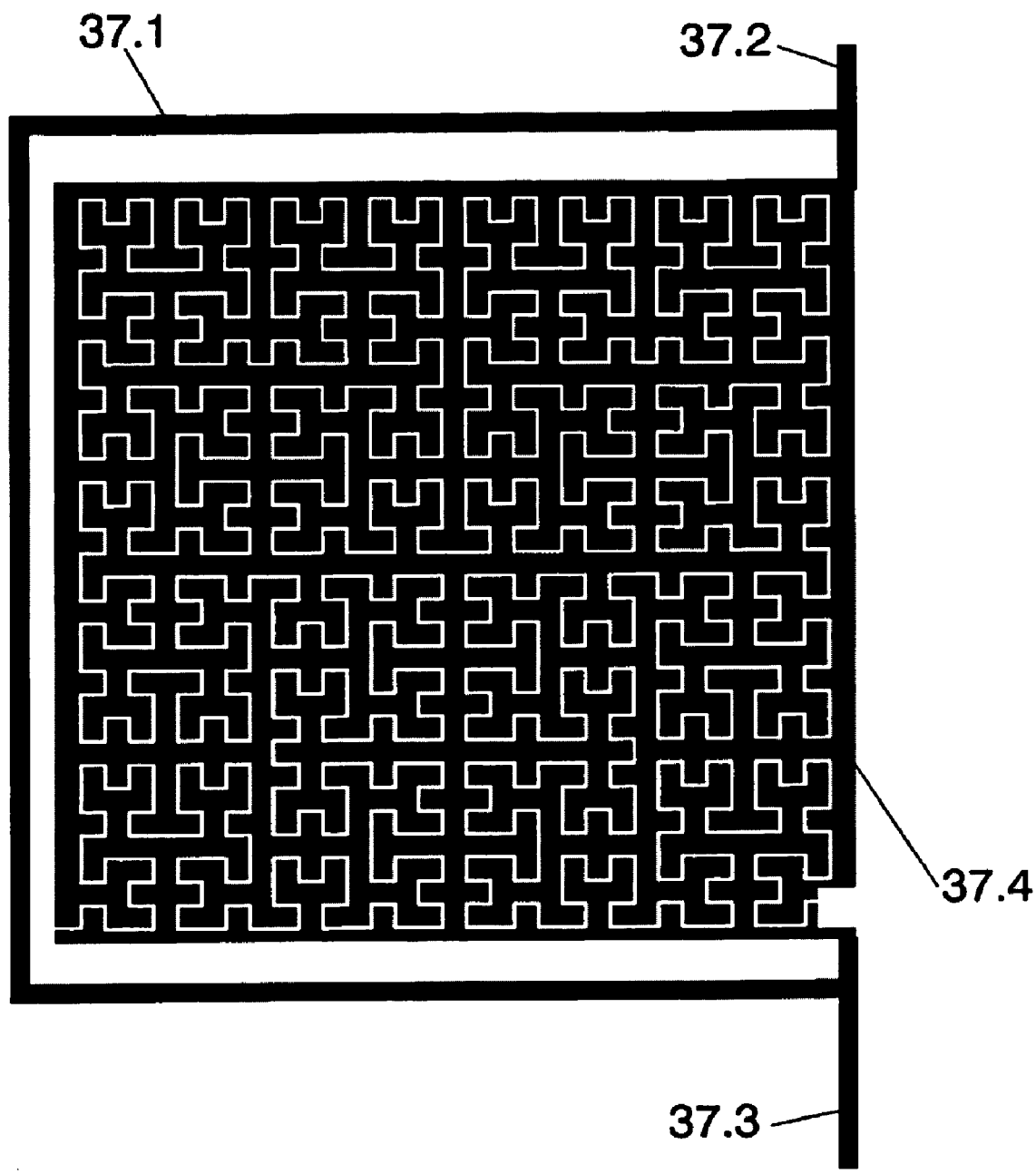
FIG. 37 shows another embodiment of a parallel planar resonator comprising an inducting strip connected in parallel to a SFC capacitor. As it is clear to those skilled in the art, the resonator can be used as a filter or part of a filter, and more than two stages of first order resonators can be used.

FIG. 37 shows another embodiment of a parallel planar resonator comprising an inducting strip (37.1) connected in parallel to an SFC capacitor (37.4). The input and output ports of the resonator are (37.2) and (37.3). As it is clear to those skilled in the art, the resonator can be used as a filter or part of a filter, and more than two stages of first order resonators can be used.

Figure 38:
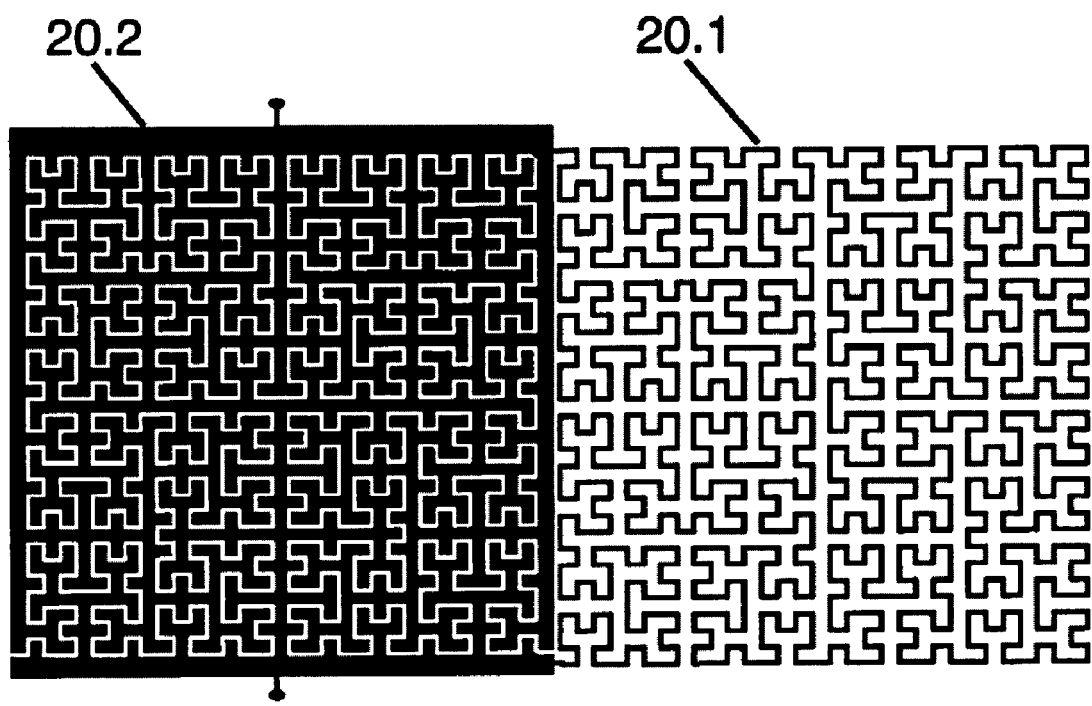
FIG. 38 shows an example of a parallel planar resonator comprising a planar SFC capacitor including a SFC-shaped gap and an inductor connected in parallel constructed by means of a SFC strip.

FIG. 38 shows an example of a parallel planar resonator comprising a planar SFC capacitor (20.2) including a SFC-shaped gap and an inductor (20.1) connected in parallel constructed by means of a SFC strip.

FIGS. 36, 37, and 38 disclose a construction of several lumped and quasi-lumped resonators using SFC curves. The SFC-based capacitors as shown in FIG. 16 are connected in series or parallel to other metallic or superconducting strips (36.1, 37.1), which can be adjusted in length to achieve the desired resonant frequency. The metallic or superconducting strip used in conjunction with the SFC capacitor, can optionally be shaped as a SFC curve as shown in FIG. 36 and FIG. 38. In a preferred embodiment, the resonating structure can be integrated in the same plane as the characteristic strip of a micro-strip, strip-line, co-planar line or parallel-plate circuit. In another preferred embodiment, the resonating structure can be used as a stand-alone component packed, for instance, as a surface mounted device (SMD). Those skilled in the art will notice that the stand-alone configuration can also be used in another preferred embodiment as being proximity coupled to a planar circuit either by mounting the resonator in the same plane as the circuit or in a different plane as done in flip-chip mountings.

Figure 39:
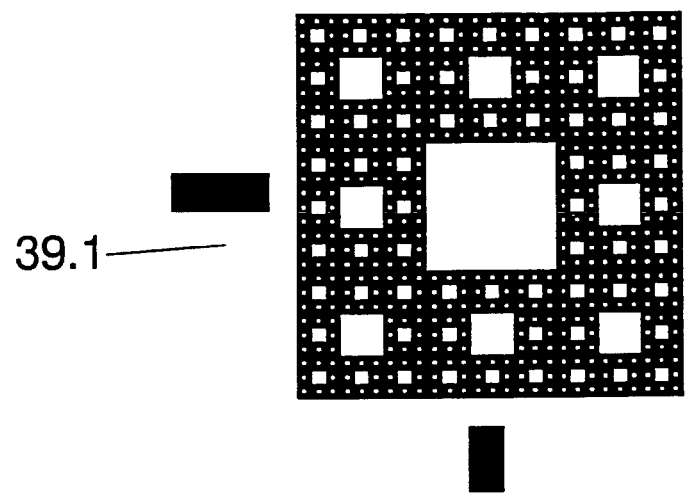
FIG. 39 shows three examples of planar, two-dimensional, microstrip patch resonators formed by a fractal pattern, a one-dimensional repetition of a fractal pattern, or a two-dimensional repetition of a fractal pattern.
Figure 39:
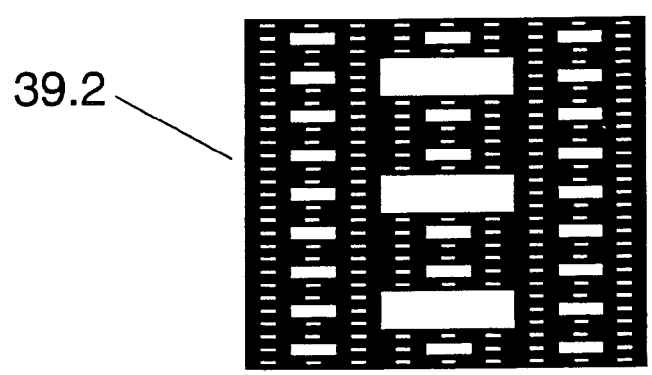
Figure 39:
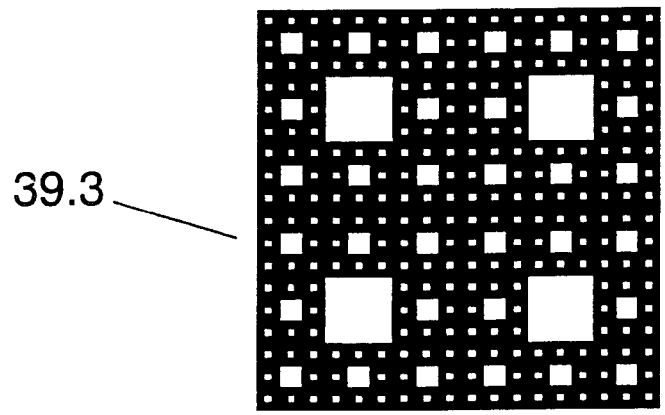

FIG. 39 shows three examples of planar, two-dimensional, microstrip patch resonators formed by a fractal pattern (Sierpinski Carpet, (39.1)), a one-dimensional repetition of a fractal pattern (39.2), or a two-dimensional repetition of a fractal pattern (39.3). FIG. (39.1) also shows an example of a possible use of these resonators, taking advantage of their dual resonant modes.

Figure 40:
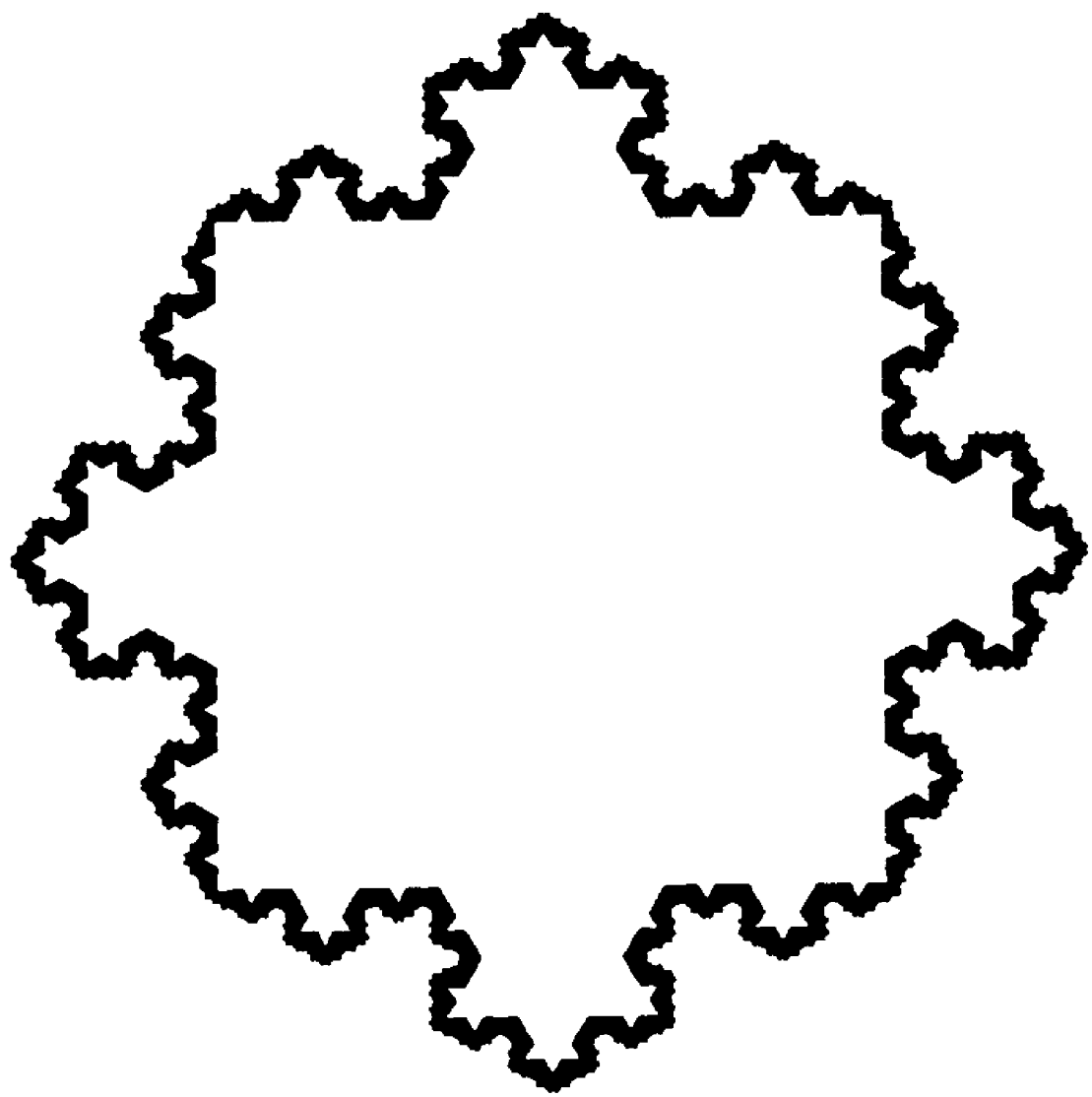
FIG. 40 shows a microstrip loop resonator shaped as a closed space-filling curve based on the Koch curve.

FIG. 40 shows a microstrip loop resonator shaped as a closed space-filling curve based on the Koch curve. As in the microstrip or stripline ring resonators, the degenerate modes in this resonator can be used in planar filters.

Figure 41:
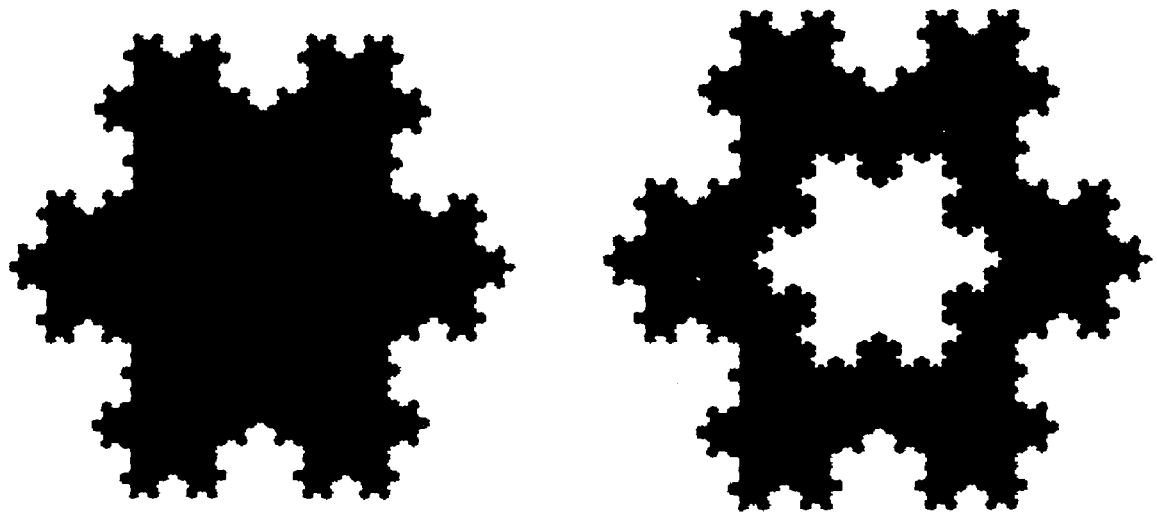
FIG. 41 shows two microstrip patch of space-filling perimeter based on the fractal Koch curve.

FIG. 41 shows a microstrip patch of space-filling perimeter based on the fractal Koch curve (41.1). To further reduce the resonant frequency of the structure, a hole with a SFC perimeter can be placed inside the patch as shown in FIG. (41.2).

FIG. 39 and FIG. 41 describe another preferred embodiment of a SFC and a fractal-based structure to construct a miniature resonator. A micro-strip or strip-line patch resonator is a solid flat island-like metallic or superconducting structure which is patterned in the same way as the strips of the microstrip and strip-line transmission lines described in FIG. 2. We disclose here a new method of lowering the resonant frequency of such patch resonator by means of SFC and fractal-based structures. In a preferred embodiment the perimeter of the patch is shaped as a SFC or FSFC curve (41.1); optionally a centre hole with a SFC or FSFC perimeter (41.2) can be used to further reduce the resonating frequency. In another preferred embodiment, a structure based on a fractal surface pattern such as the Sierpinski Carpet can be used to reduce the resonant frequency (FIG. 39).

As it can be readily seen to those skilled in the art, the disclosed fractal and SFC patch resonators (FIG. 39 and FIG. 41) can also be operated in a multi-mode configuration. That is, advantage can be taken of the several degenerate modes that resonate at the same frequency to implement a multi-pole filter with a reduced number of resonant structures. To couple the several degenerate modes a conventional technique is applied which consists of slightly perturbing the patch geometry (for instance but not limited to: cutting a corner, adding a notch or a small strip).

Multi-mode resonators can also be constructed with transmission line loops having adequate symmetries as readily known by those skilled in the art. SFC and FSFC loops as for instance those shown in FIG. 8 and FIG. 41 can be used to construct a multi-mode miniature resonator. The coupling among the degenerate modes is done using the techniques cited above.

Another preferred embodiment of a SFC, fractal or FSFC network consists of depositing a resistive material strip over a dielectric substrate wherein the strip is shaped as a SFC, fractal or FSFC curve. In this particular embodiment, the curve does not form a closed loop and the two tips of the curve form the terminals of the resistor. As readily known by those skilled in the art, metallic bonds can be attached to the tips to form the input and output connecting points. The resistors can be packed in any of the well-known configurations described in the prior art (such as for instance a SMD component) or integrated in electric or microwave circuits in conjunction with other circuital components. The advantage of using the SFC and other geometries described in the present invention is that the size of the component is dramatically reduced, while increasing the resistance yet keeping the parasitic reactance of the component low compared to the prior art.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

The invention claimed is:

1. An electromagnetic transmission line, comprising:
    a plurality of cascaded transmission line segments, each of the cascaded transmission line segments forming a space-filling curve (SFC),
    said SFC including at least twenty (20) connected straight segments, wherein said straight segments are each smaller than a tenth of the operating free-space wave length of the electromagnetic transmission line, wherein said straight segments are spatially arranged such that no two adjacent and connected segments form another longer straight segment, and wherein none of said straight segments intersect with another straight segment, wherein each pair of adjacent straight segments forms a corner; and
    wherein each pair of adjacent straight segments are generally orthogonal to each other and comprise segments of a Hilbert curve.

2. The electromagnetic transmission line of claim 1, wherein one or more of the corners formed by adjacent straight segments in the SFC are rounded.

3. The electromagnetic transmission line of claim 1, wherein one or more of said SFC has a Haussdorf dimension (D) larger than unity.

4. The electromagnetic transmission line of claim 1, wherein one or more of said SFC is a fractal space-filling curve (FSFC).

5. The electromagnetic transmission line of claim 1, wherein the electromagnetic transmission line is included in an electromagnetic resonator.

6. The electromagnetic transmission line of claim 1, wherein one or more of said SFC forms a HilbertZZ curve.

7. The electromagnetic transmission line of claim 1, wherein each of the plurality of cascaded transmission line segments comprises four (4) cascaded Hilbert curves.

8. The electromagnetic transmission line of claim 1, wherein two or more of the plurality of cascaded transmission line segments are separated by a capacitive gap.

* * * * *